(12) United States Patent
Usui

(10) Patent No.: US 11,145,634 B2
(45) Date of Patent: Oct. 12, 2021

(54) POWER CONVERTER

(71) Applicant: Mitsubishi Electric Corporation, Tokyo (JP)

(72) Inventor: Yuhei Usui, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 26 days.

(21) Appl. No.: 16/629,338

(22) PCT Filed: Jul. 21, 2017

(86) PCT No.: PCT/JP2017/026390
§ 371 (c)(1),
(2) Date: Jan. 8, 2020

(87) PCT Pub. No.: WO2019/016929
PCT Pub. Date: Jan. 24, 2019

(65) Prior Publication Data
US 2021/0143136 A1 May 13, 2021

(51) Int. Cl.
*H01L 25/11* (2006.01)
*H01L 23/498* (2006.01)
(Continued)

(52) U.S. Cl.
CPC ...... *H01L 25/115* (2013.01); *H01L 23/49811* (2013.01); *H01L 23/49822* (2013.01); *H02M 7/003* (2013.01); *H02M 7/53871* (2013.01)

(58) Field of Classification Search
CPC ......... H01L 23/49811; H01L 23/49822; H01L 25/115; H02M 7/003
See application file for complete search history.

(56) References Cited

U.S. PATENT DOCUMENTS

2014/0167235 A1 6/2014 Horie
2015/0115288 A1 4/2015 Tamada et al.
(Continued)

FOREIGN PATENT DOCUMENTS

JP 2014120734 A 6/2014
JP 2016-046842 A 4/2016
(Continued)

OTHER PUBLICATIONS

Office Action dated Jul. 30, 2020, by the India Patent Office in corresponding India Patent Application No. 201927051175, with English translation. (5 pages).
(Continued)

*Primary Examiner* — Allan R Wilson
(74) *Attorney, Agent, or Firm* — Buchanan Ingersoll & Rooney PC

(57) ABSTRACT

The power converter includes a semiconductor module including a first semiconductor element and a second semiconductor element connected in series, a multilayer substrate including a first wire connected to a first signal terminal of the first semiconductor element, a second wire connected to a second signal terminal of the first semiconductor element, a third wire connected to a third signal terminal of the second semiconductor element, and a fourth wire connected to a fourth signal terminal of the second semiconductor element, a first external connection terminal to which the first wire and the second wire are connected, and a second external connection terminal to which the third wire and the fourth wire are connected, the first and third wires being formed on a first layer with an insulating region interposed therebetween, the second and fourth wires being formed on a second layer with an insulating region interposed therebetween.

11 Claims, 13 Drawing Sheets

(51) Int. Cl.
*H02M 7/00* (2006.01)
*H02M 7/5387* (2007.01)

(56) References Cited

U.S. PATENT DOCUMENTS

2016/0373017 A1    12/2016  Mima et al.
2017/0077068 A1*    3/2017  Horio .................... H01L 23/492

FOREIGN PATENT DOCUMENTS

WO    2014/014012 A1    1/2014
WO    2015/136593 A1    9/2015

OTHER PUBLICATIONS

International Search Report (with English Translation) and Written Opinion issued in corresponding International Patent Application No. PCT/JP2017/026390, 6 pages (dated Sep. 19, 2017).

* cited by examiner

POWER CONVERTER

FIELD

The present invention relates to a power converter including a power semiconductor module.

BACKGROUND

In recent years, power converters such as an in-vehicle inverter for a railway vehicle, which perform power conversion by a switching operation of a power semiconductor element, have become widespread. The power semiconductor element is sealed with resin, and constitutes a power semiconductor module. The power semiconductor module is used for the power converter.

Further, a semiconductor module called "two-in-one (2-in-1) module" has also become widespread. The 2-in-1 module integrates a pair of positive and negative power semiconductor elements into one. The positive and negative power semiconductor elements respectively constitute upper and lower arms for a single phase of the inverter.

In order to perform switching of the power semiconductor elements, a terminal for controlling the semiconductor module is provided. Patent Literature 1 discloses a semiconductor module including an auxiliary terminal.

CITATION LIST

Patent Literature

Patent Literature 1: Japanese Patent Application Laid-open No. 2014-120734

SUMMARY

Technical Problem

Conventionally, the terminal for controlling the semiconductor module is connected to a control circuit by wiring a cable. For example, in a case where a control terminal of a 2-in-1 semiconductor module is connected a control circuit by a conventional cable wire, four terminals including a gate terminal and a source terminal of the upper arm of the semiconductor module and a gate terminal and a source terminal of the lower arm of the semiconductor module need to be respectively connected to the control circuit. Thus, four cable wires are needed for connecting a single semiconductor module and the control circuit. This leads to a problem that as the number of cable wires is increased, the size of the power converter is increased.

Solution to Problem

A power converter according to the present invention includes a semiconductor module and a multilayer substrate. The semiconductor module includes: a first main terminal; a second main terminal; and a third main terminal. The semiconductor module further includes a first semiconductor element in which: a collector potential or a drain potential is applied to the first main terminal; a gate potential is applied to a first signal terminal; and an emitter potential or a source potential is applied to the third main terminal and a second signal terminal. The semiconductor module further includes a second semiconductor element in which: a collector potential or a drain potential is applied to the third main terminal; a gate potential is applied to a third signal terminal; and an emitter potential or a source potential is applied to the second main terminal and a fourth signal terminal, where the second semiconductor element is connected in series to the first semiconductor element. The multilayer substrate includes: a first wire connected to the first signal terminal; a second wire connected to the second signal terminal; a third wire connected to the third signal terminal; and a fourth wire connected to the fourth signal terminal. The multilayer substrate further includes a first external connection terminal to which the first wire and the second wire are connected; and a second external connection terminal to which the third wire and the fourth wire are connected, where the first wire and the third wire are formed on a first layer with an insulating region interposed therebetween, the second wire and the fourth wire are formed on a second layer with an insulating region interposed therebetween.

Advantageous Effects of Invention

The power converter according to the present invention includes a semiconductor module and a multilayer substrate. The semiconductor module includes: a first main terminal; a second main terminal; a third main terminal; a first semiconductor element; and a second semiconductor element. In the first semiconductor element: a collector potential or a drain potential is applied to the first main terminal; a gate potential is applied to a first signal terminal; and an emitter potential or a source potential is applied to the third main terminal and a second signal terminal. In the second semiconductor element: a collector potential or a drain potential is applied to the third main terminal; a gate potential is applied to a third signal terminal; and an emitter potential or a source potential is applied to the second main terminal and a fourth signal terminal. The second semiconductor element is connected in series to the first semiconductor element. The multilayer substrate includes: a first wire connected to the first signal terminal; a second wire connected to the second signal terminal; a third wire connected to the third signal terminal; and a fourth wire connected to the fourth signal terminal. The multilayer substrate further includes: a first external connection terminal to which the first wire and the second wire are connected; and a second external connection terminal to which the third wire and the fourth wire are connected. The first wire and the third wire are formed on a first layer with an insulating region interposed therebetween, the second wire and the fourth wire are formed on a second layer with an insulating region interposed therebetween. Accordingly, the number of cable wires can be decreased, and the power converter can be downsized accordingly.

DESCRIPTION OF EMBODIMENTS

First Embodiment

Figure 1:
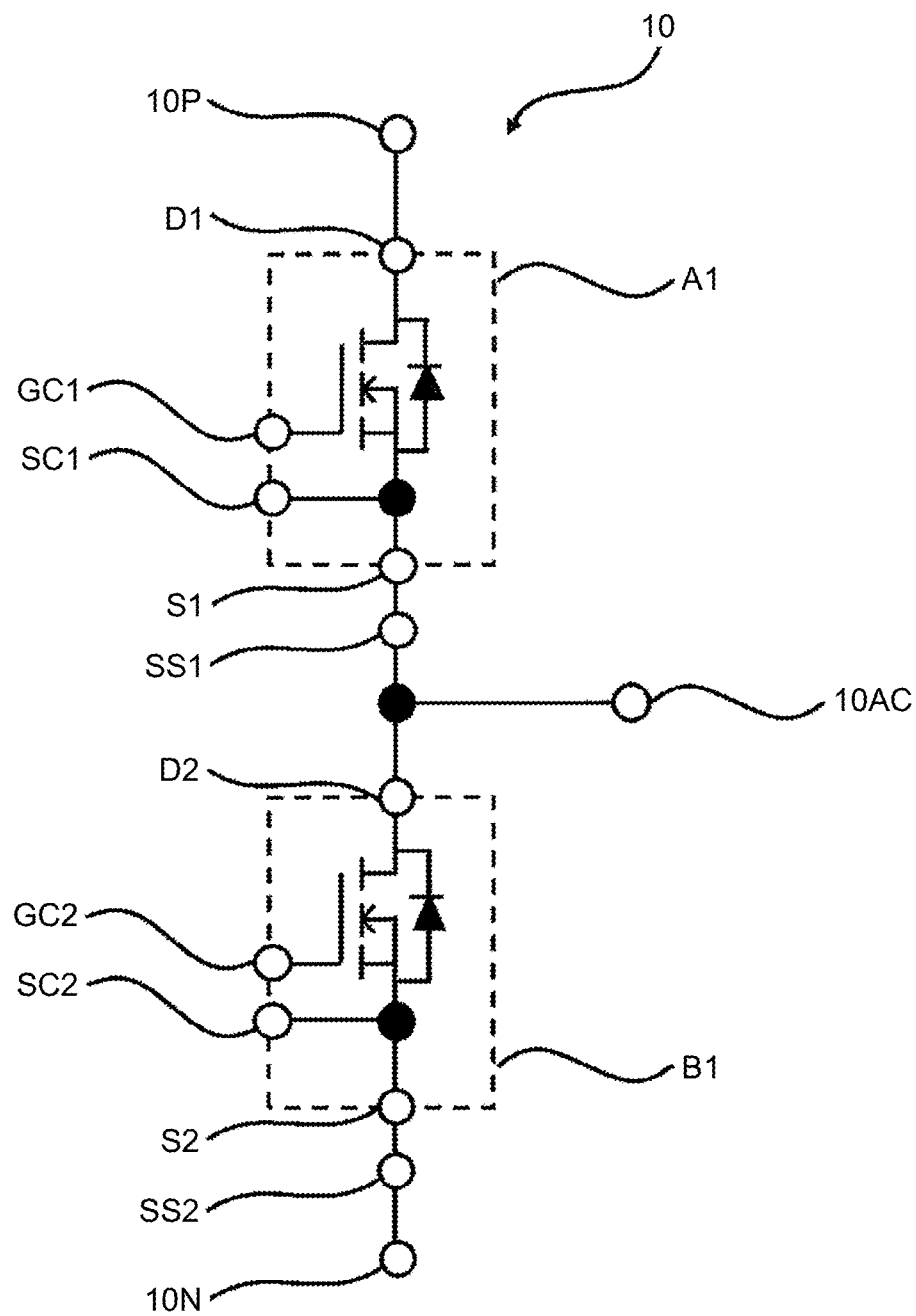
FIG. 1 is a circuit diagram illustrating a configuration of essential parts of a power converter 1 according to a first embodiment.

FIG. 1 is a circuit diagram illustrating a configuration of essential parts of a power converter 1 according to a first embodiment. FIG. 1 is a circuit diagram illustrating a semiconductor module 10 used in the power converter 1. The semiconductor module 10 is configured by including a first semiconductor element A1 connected to a main terminal 10P and a second semiconductor element B1 connected to a main terminal 10N. The semiconductor element A1 and the semiconductor element B1 are connected in series. The electrical connection point of the semiconductor element A1 and the semiconductor element B1 is connected to a main terminal 10AC.

For example, the semiconductor module 10 constitutes a U-phase leg of a three-phase two-level inverter circuit. The semiconductor element A1 is also referred to as "positive arm" or "upper arm". The semiconductor element B1 is also referred to as "negative arm" or "lower arm".

The semiconductor element A1 is provided with a drain terminal D1 connected to the main terminal 10P, a source terminal S1 connected to the main terminal 10AC, a first signal terminal GC1, and a second signal terminal SC1. The drain terminal has a drain potential. The source terminal has a source potential. The first signal terminal GC1 has a gate potential.

The semiconductor element B1 is provided with a drain terminal D2 connected to the main terminal 10AC, a source terminal S2 connected to the main terminal 10N, a third signal terminal GC2, and a fourth signal terminal SC2. The drain terminal has a drain potential. The source terminal has a source potential. The third signal terminal GC2 has a gate potential.

The semiconductor module 10 is provided with sense source terminals SS1 and SS2 for detecting a current. The sense source terminal SS1 is connected to the source terminal of the semiconductor element A1, while the sense source terminal SS2 is connected to the source terminal of the semiconductor element B1. Providing the sense source terminals SS1 and SS2 makes it possible to detect an overcurrent.

The main terminal 10P is connected to a direct-current busbar on the higher-potential side. The main terminal 10N is connected to a direct-current busbar on the lower-potential side. The main terminal 10AC is connected to a load. When the semiconductor element A1 is electrically conducting, a potential of the direct-current busbar on the higher-potential side is applied to the load. When the semiconductor element B1 is electrically conducting, a potential of the direct-current busbar on the lower-potential side is applied to the load. In this manner, the power converter 1 outputs two levels of potentials such as a potential of the direct-current busbar on the higher-potential side and a potential of the direct-current busbar on the lower-potential side. Thus, the power converter 1 operates as a two-level power converter. In order to switch between the semiconductor elements to be electrically conducting, the semiconductor module 10 is connected to a control circuit (not illustrated). In other words, in order to switch the semiconductor elements between ON and OFF by a switching operation, the semiconductor module 10 is connected to a control circuit (not illustrated). Specifically, the control circuit is connected to the first signal terminal GC1, the second signal terminal SC1, the third signal terminal GC2, and the fourth signal terminal SC2 to control ON/OFF of the semiconductor element A1 and the semiconductor element B1. The phrase "switch the semiconductor element ON" described herein refers to bringing the semiconductor element into a conducting state, while the phrase "switch the semiconductor element OFF" described herein refers to bringing the semiconductor element into a non-conducting state.

In each of the semiconductor elements A1 and B1, a transistor element and a diode element are connected in parallel. The connection of each diode element may be omitted in some cases depending on the load characteristics, for example, when the load is a resistance load.

Although FIG. 1 illustrates a MOSFET as a transistor element, the transistor element is not limited to the MOSFET, and may be any device as long as the device can be switched between a lower-resistance state and a higher-resistance state by an electrical signal. For example, it is allowable to use a transistor element such as an IGBT and a bipolar transistor. When the transistor element is an IGBT, the "drain terminal" is replaced with a "collector terminal", while the "source terminal" is replaced with an "emitter terminal". The transistor elements and diode elements that constitute the semiconductor elements A1 and B1 can be formed using materials such as Si (silicon), SiC (silicon carbide), and GaN (gallium nitride).

Figure 2:
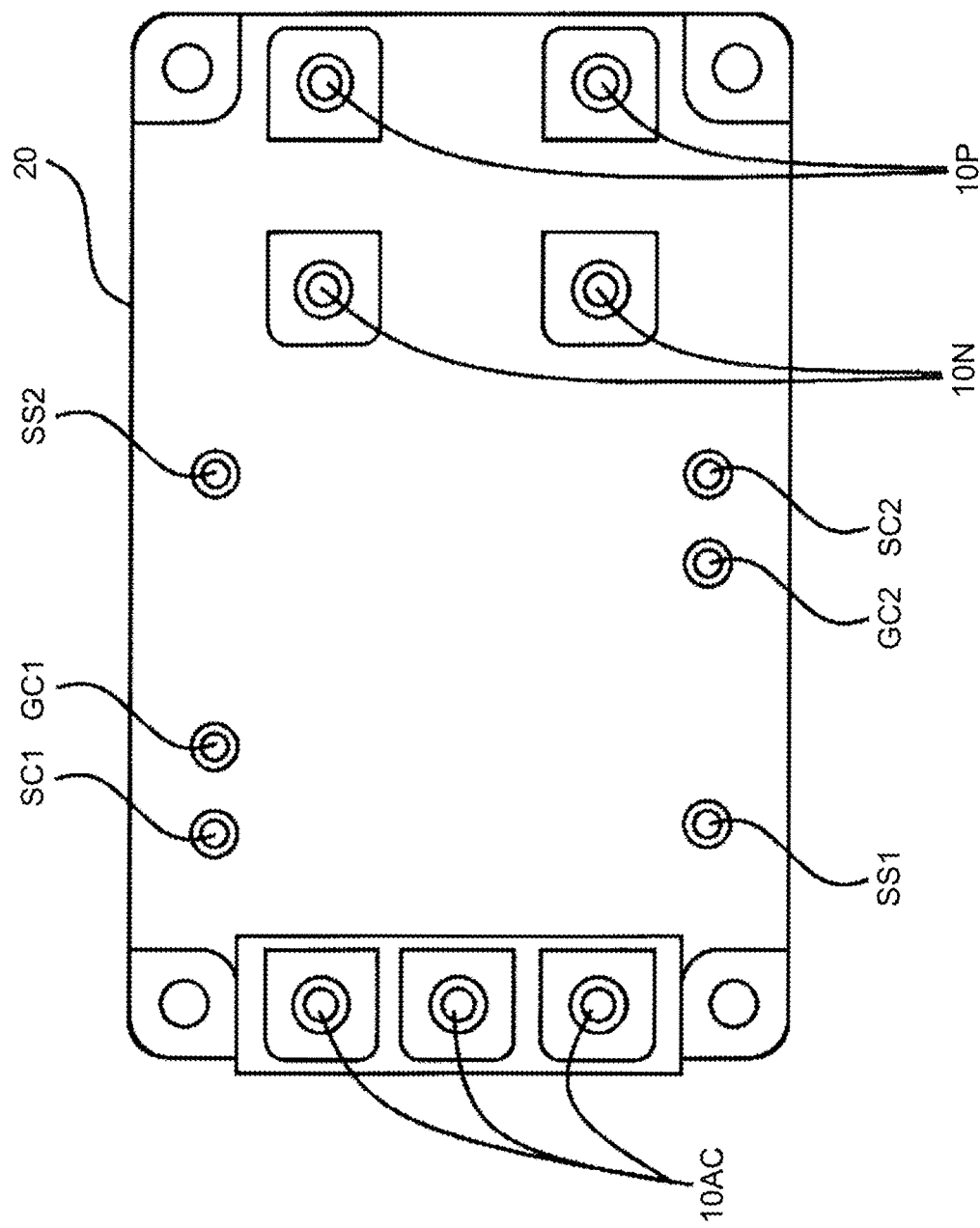
FIG. 2 is a plan view of a package having accommodated therein a semiconductor module according to the first embodiment.

FIG. 2 is a plan view of a package having accommodated therein the semiconductor module 10 used in the power converter 1 according to the first embodiment. Although not illustrated in FIG. 2, the semiconductor element A1 and the semiconductor element B1 connected in series are included inside a package 20.

As illustrated in FIG. 2, the main terminal 10P, the main terminal 10N, and the main terminal 10AC are provided on one surface side of the package 20. Two main terminals 10P are provided at one end portion of the package 20 in the longitudinal direction, and are located along a direction perpendicular to the longitudinal direction. Two main terminals 10N are provided closer to the central portion of the package 20 relative to the main terminals 10P, and are located along a direction perpendicular to the longitudinal direction of the package 20. The number of the main terminals 10P is not limited to two. The number of the main terminals 10N is not limited to two. The number of the main terminals 10P may be one or may be three or more. The number of the main terminals 10N may be one or may be three or more. Three main terminals 10AC are provided at the other end portion of the package 20 in the longitudinal direction, and are located along a direction perpendicular to the longitudinal direction. The number of the main terminals 10AC is not limited to three. The number of the main terminals 10AC may be one or two, or may be four or more.

The main terminals 10P constitute a direct-current positive terminal P of the semiconductor module 10. The main terminals 10N constitute a direct-current negative terminal N of the semiconductor module 10. The main terminals 10AC constitute an alternating-current terminal AC of the semiconductor module 10.

The first signal terminal GC1, the second signal terminal SC1, the third signal terminal GC2, the fourth signal terminal SC2, the sense source terminal SS1, and the sense source terminal SS2 are provided between the main terminal 10N and the main terminal 10AC. In other words, the above described signal terminals and sense source terminals are provided between a direct-current terminal and an alternating-current terminal. The second signal terminal SC1, the first signal terminal GC1, and the sense source terminal SS2 are provided along one side of the package 20 in the longitudinal direction from the side of the main terminals 10AC. The sense source terminal SS1, the third signal terminal GC2, and the fourth signal terminal SC2 are provided along the other side of the package 20 in the longitudinal direction from the side of the main terminals 10AC.

The first signal terminal GC1, the second signal terminal SC1, the third signal terminal GC2, the fourth signal terminal SC2, the sense source terminal SS1, and the sense source terminal SS2 are connected to a multilayer substrate to be described later.

Figure 3:
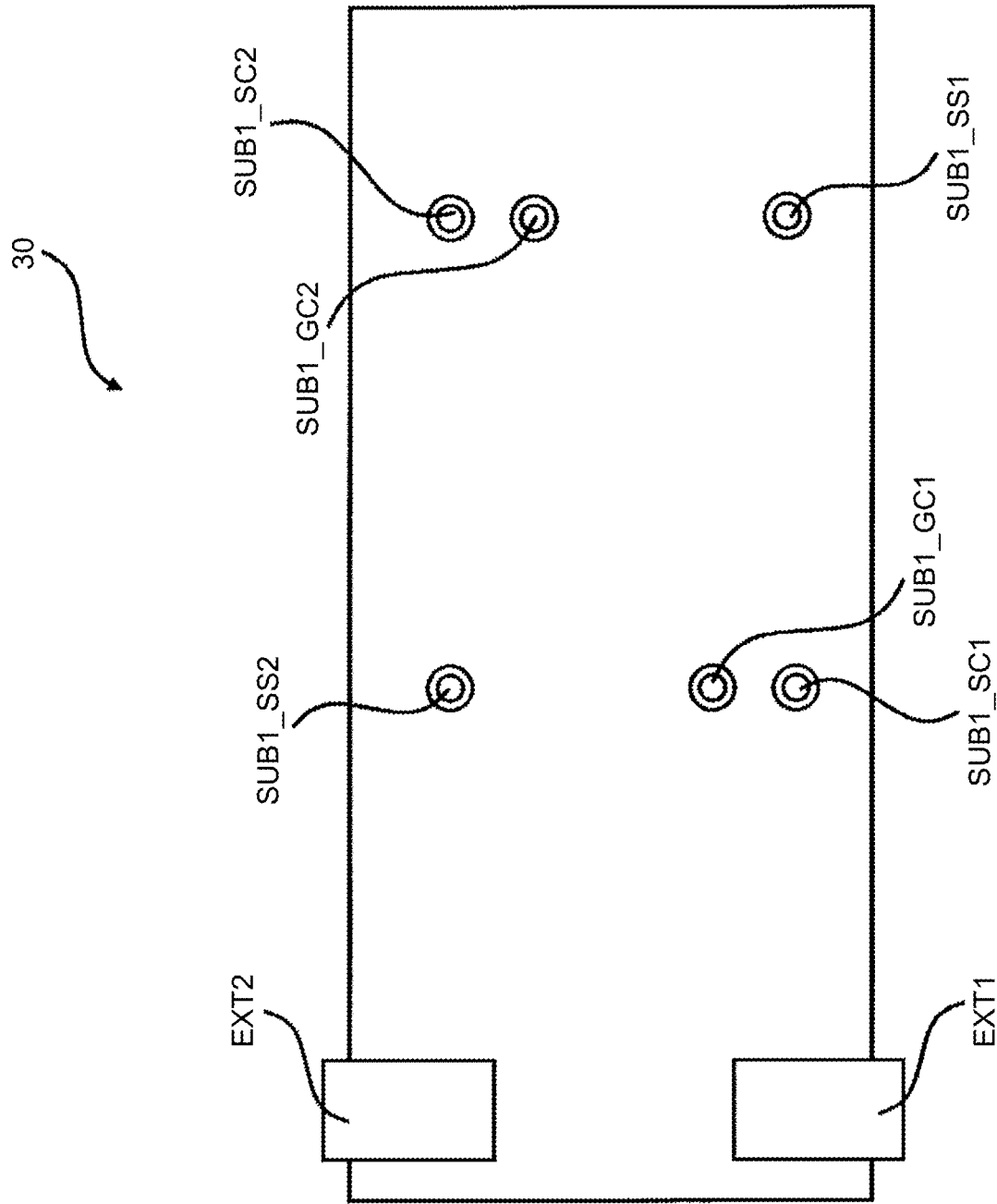
FIG. 3 is a plan view of a multilayer substrate used in the power converter 1 according to the first embodiment.

FIG. 3 is a plan view of a multilayer substrate used in the power converter 1 according to the first embodiment. In FIG. 3, a multilayer substrate 30 is formed of five layers. FIG. 3 illustrates a first layer that is a visible layer referred to as "surface". From the surface, the first layer, a second layer, a third layer, a fourth layer, and a fifth layer are formed in the described order. The fifth layer is a visible layer referred to as "reverse side". The diagrams described below illustrate the multilayer substrate when viewed in the direction from the surface.

On the surface of the multilayer substrate 30, a first external connection terminal EXT1 and a second external connection terminal EXT2 are mounted. The first external connection terminal EXT1 and the second external connection terminal EXT2 are connected to the control circuit by a cable wire. In FIG. 3, the external connection terminals EXT1 and EXT2 are mounted on the surface. However, the external connection terminals EXT1 and EXT2 may be mounted on the reverse side.

As a pattern, a first signal terminal connection pattern SUB1_GC1, a second signal terminal connection pattern SUB1_SC1, a third signal terminal connection pattern SUB1_GC2, a fourth signal terminal connection pattern SUB1_SC2, and sense-source-terminal connection patterns SUB1_SS1 and SUB1_SS2 are formed.

The first signal terminal connection pattern SUB1_GC1, the second signal terminal connection pattern SUB1_SC1, the third signal terminal connection pattern SUB1_GC2, the fourth signal terminal connection pattern SUB1_SC2, and the sense-source-terminal connection patterns SUB1_SS1 and SUB1_SS2 are electrically connected to a reverse side pattern through respective through holes.

The first signal terminal connection pattern SUB1_GC1 is a pattern for connecting to the first signal terminal GC1 of the semiconductor module 10. The second signal terminal connection pattern SUB1_SC1 is a pattern for connecting to the second signal terminal SC1 of the semiconductor module 10. The third signal terminal connection pattern SUB1_GC2 is a pattern for connecting to the third signal terminal GC2 of the semiconductor module 10. The fourth signal terminal connection pattern SUB1_SC2 is a pattern for connecting to the fourth signal terminal SC2 of the semiconductor module 10. The sense-source-terminal connection pattern SUB1_SS1 is a pattern for connecting to the sense source terminal SS1 of the semiconductor module 10. The sense-source-terminal connection pattern SUB1_SS2 is a pattern for connecting to the sense source terminal SS2 of the semiconductor module 10.

The first signal terminal connection pattern SUB1_GC1, the second signal terminal connection pattern SUB1_SC1, the third signal terminal connection pattern SUB1_GC2, the fourth signal terminal connection pattern SUB1_SC2, and the sense-source-terminal connection patterns SUB1_SS1 and SUB1_SS2 are electrically connected to the semiconductor module 10 by fastening these patterns and the semiconductor module 10 with respective fastening members such as screws.

Figure 4A:
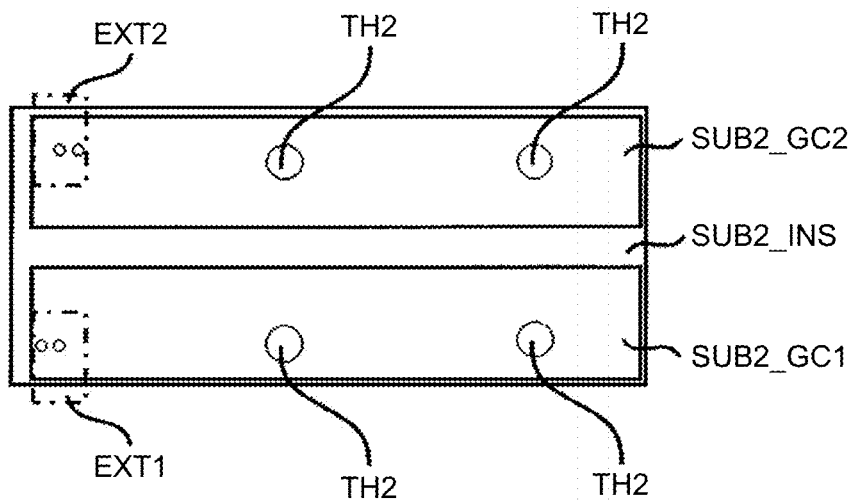
FIGS. 4A-4C are diagrams illustrating pattern examples of second to fourth layers of the multilayer substrate used in the power converter 1 according to the first embodiment.
Figure 4B:
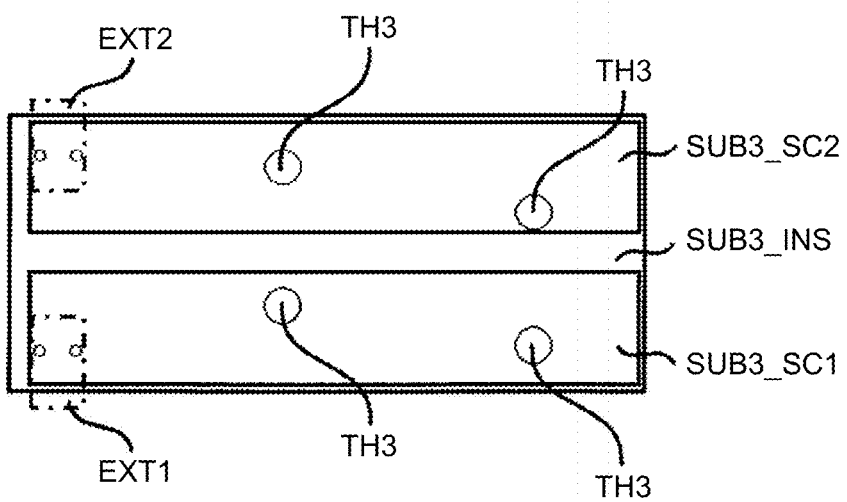
Figure 4C:
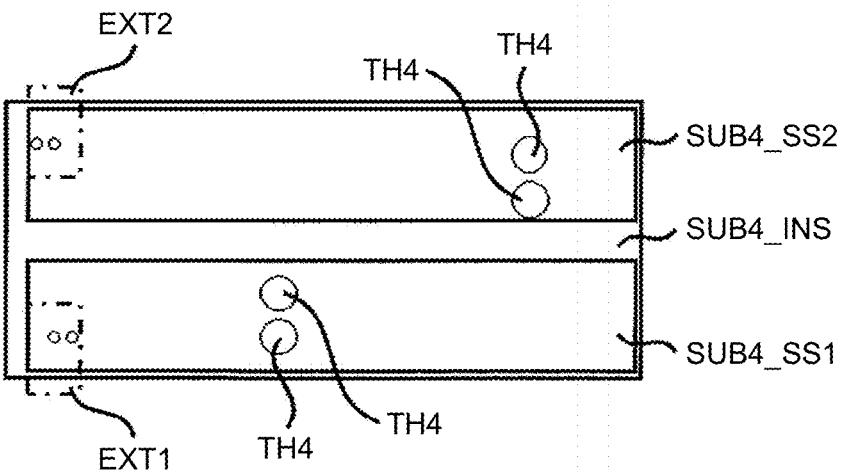

FIGS. 4A, 4B, 4C are diagrams illustrating pattern examples of the second layer, the third layer, and the fourth layer of the multilayer substrate 30. In order to facilitate understanding, FIGS. 4A, 4B, 4C illustrate the positions of the first external connection terminal EXT1 and the second external connection terminal EXT2 by the dot-and-dash line. In FIGS. 4A, 4B, 4C, a conductive member is formed of copper and other materials. An insulating member is formed of glass epoxy resin prepreg and other materials. However, the materials of the conductive member and the insulating member are not limited thereto.

FIG. 4A illustrates the second layer of the multilayer substrate 30, to which the first signal terminal GC1 and the third signal terminal GC2 are electrically connected. Specifically, the first signal terminal connection pattern SUB2_GC1 is electrically connected to the first signal terminal GC1, and the third signal terminal connection pattern SUB2_GC2 is electrically connected to the third signal terminal GC2. A through hole TH2 is provided for electrical connection with another layer. At the location where the through hole TH2 is provided, the first signal terminal connection pattern SUB2_GC1 and the third signal terminal connection pattern SUB2_GC2 are not formed. Between the first signal terminal connection pattern SUB2_GC1 and the third signal terminal connection pattern SUB2_GC2, a conductive member is not formed, but an insulating region SUB2_INS is formed. The insulating region SUB2_INS is formed to ensure electrical insulation between the first signal terminal connection pattern SUB2_GC1 and the third signal terminal connection pattern SUB2_GC2. The second layer of the multilayer substrate 30 is a layer to which the gate potential of the semiconductor element A1 and the gate potential of the semiconductor element B1 are applied. In other words, the gate potential of the semiconductor element A1 and the gate potential of the semiconductor element B1 are wired on the same layer.

FIG. 4B illustrates the third layer of the multilayer substrate 30, to which the second signal terminal SC1 and the fourth signal terminal SC2 are electrically connected. Specifically, the second signal terminal connection pattern SUB3_SC1 is electrically connected to the second signal terminal SC1, and the fourth signal terminal connection pattern SUB3_SC2 is electrically connected to the fourth signal terminal SC2. A through hole TH3 is provided for electrical connection with another layer. At the location where the through hole TH3 is provided, the second signal terminal connection pattern SUB2_SC1 and the fourth signal terminal connection pattern SUB2_SC2 are not formed. Between the second signal terminal connection pattern SUB3_SC1 and the fourth signal terminal connection pattern SUB3_SC2, a conductive member is not formed, but an insulating region SUB3_INS is formed. The insulating region SUB3_INS is formed to ensure electrical insulation between the second signal terminal connection pattern SUB3_SC1 and the fourth signal terminal connection pattern SUB3_SC2. The third layer of the multilayer substrate 30 is a layer to which the source potential of the semiconductor element A1 and the source potential of the semiconductor element B1 are applied. In other words, the source potential of the semiconductor element A1 and the source potential of the semiconductor element B1 are wired on the same layer.

FIG. 4C illustrates the fourth layer of the multilayer substrate 30, to which the sense source terminal SS1 and the sense source terminal SS2 are electrically connected. Specifically, the sense-source-terminal connection pattern SUB4_SS1 is electrically connected to the sense source terminal SS1, and the sense-source-terminal connection pattern SUB4_SS2 is electrically connected to the sense source terminal SS2. A through hole TH4 is provided for electrical connection with another layer. At the location where the through hole TH4 is provided, the sense-source-terminal connection pattern SUB4_SS1 and the sense-source-terminal connection pattern SUB4_SS2 are not formed. Between the sense-source-terminal connection pattern SUB4_SS1 and the sense-source-terminal connection pattern SUB4_SS2, a conductive member is not formed, but an insulating region SUB4_INS is formed. The insulating region SUB4_INS is formed to ensure electrical insulation between the sense-source-terminal connection pattern SUB4_SS1 and the sense-source-terminal connection pattern SUB4_SS2. The fourth layer of the multilayer substrate 30 is a layer to which a sense source potential of the semiconductor element A1 and a sense source potential of the semiconductor element B1 are applied. In other words, the sense source potential of the semiconductor element A1 and the sense source potential of the semiconductor element B1 are wired on the same layer.

The multilayer substrate 30 used in the power converter 1 is provided with an insulating region so as to form wires at the same electrical potential on the same layer. This eliminates the need for separating the layers from each other for individual signal terminals, and thus facilitates design of the multilayer substrate 30.

As is understood from FIGS. 4A, 4B, 4C, the pattern to be connected to the semiconductor element A1 and the pattern to be connected to the semiconductor element B1 are formed with an insulating region interposed between these patterns. That is, the pattern to be connected to the semiconductor element A1 is formed along one side of the multilayer substrate 30 in the longitudinal direction, while the pattern to be connected to the semiconductor element B1 is formed along the other side of the multilayer substrate 30 in the longitudinal direction. The patterns formed in this manner prevent the wire connected to the semiconductor element A1 and the wire connected to the semiconductor element B1 from crossing each other. Thus, the semiconductor element A1 is less likely to be affected by noise from the semiconductor element B1, while the semiconductor element B1 is less likely to be affected by noise from the semiconductor element A1.

In FIGS. 4A, 4B, 4C, the second layer is illustrated as a layer to which the gate potential of the semiconductor element is applied, the third layer is illustrated as a layer to which the source potential of the semiconductor element is applied, and the fourth layer is illustrated as a layer to which the sense source potential of the semiconductor element is applied. However, the second, third, and fourth layers are not limited thereto. For example, it is allowable that the third layer is a layer to which the sense source potential of the semiconductor element is applied, and the fourth layer is a layer to which the source potential of the semiconductor element is applied.

However, taking into account the noise, it is preferable that the layer having the gate potential and the layer having the source potential are adjacent to each other as illustrated in FIGS. 4A, 4B, 4C. In consideration of a current path, there is a to-and-fro relation between the current path having the gate potential and the current path having the source potential. That is, as the distance between the current path having the gate potential and the current path having the source potential becomes shorter, the loop area formed by the current path having the gate potential and the current path having the source potential becomes smaller. Accordingly, an undesired signal is less likely to be induced to the loop, and thus the multilayer substrate 30 can be configured to be less affected by noise.

In FIGS. 4A, 4B, 4C, the conductive member having the gate potential and the conductive member having the source potential are formed into flat-plate shapes so as to be opposed to each other except in the region where the through hole is formed. The conductive members are formed in this manner, which can reduce the distance between the current path having the gate potential and the current path having the source potential so that the multilayer substrate 30 can be configured to be less affected by noise as described above. In a case where the wire length for connecting to the gate potential or the source potential is taken into account, for example, when it is desired to have equal wire lengths, the conductive members may not be formed into flat-plate shapes. Even in this case, patterns on the conductive member having the gate potential and the conductive member having the source potential are still formed so as to have a shorter distance between the patterns. For example, patterns are formed, which appear to be the same when the multilayer substrate is viewed from the surface. Therefore, the multilayer substrate 30 can be configured to be less affected by noise.

Figure 5:
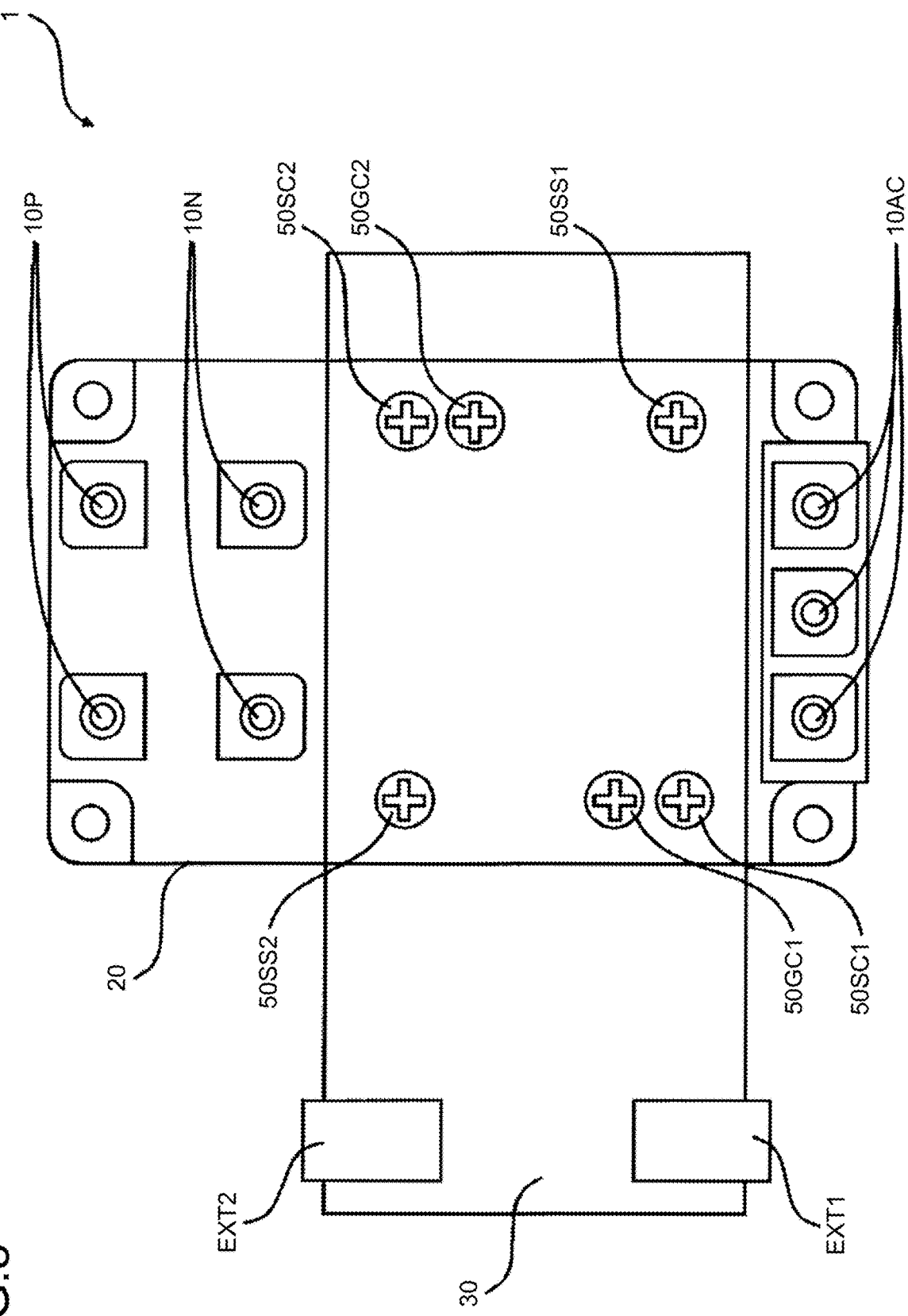
FIG. 5 is a diagram illustrating a configuration of essential parts of the power converter 1 according to the first embodiment.

FIG. 5 is a diagram illustrating a configuration of essential parts of the power converter 1 according to the first embodiment. FIG. 5 is a diagram in which the multilayer substrate 30 is connected to the package 20 having the semiconductor module 10 accommodated therein.

The first signal terminal GC1 is connected to the first signal terminal connection pattern SUB1_GC1 by a fastening member 50GC1. The second signal terminal SC1 is connected to the second signal terminal connection pattern SUB1_SC1 by a fastening member 50SC1. The third signal terminal GC2 is connected to the third signal terminal connection pattern SUB1_GC2 by a fastening member 50GC2. The fourth signal terminal SC2 is connected to the fourth signal terminal connection pattern SUB1_SC2 by a fastening member 50SC2. The sense source terminal SS1 is connected to the sense-source-terminal connection pattern SUB1_SS1 by a fastening member 50SS1. The sense source terminal SS2 is connected to the sense-source-terminal connection pattern SUB1_SS2 by a fastening member 50SS2.

In the following descriptions, when the fastening members 50GC1, 50SC1, 50GC2, 50SC2, 50SS1, and 50SS2 are not distinguished from each other, these fastening members are sometimes referred collectively to as "fastening member 50".

The fastening member 50 has not only the function of electrically connecting each terminal of the package 20 and each connection pattern of the multilayer substrate 30, but also the function of physically fixing the package 20 to the multilayer substrate 30. The fastening member 50 is a screw, a bolt, or the like.

The power converter 1 and the control circuit are connected by the first external connection terminal EXT1 and the second external connection terminal EXT2. For example, the control circuit and the first external connection terminal EXT1 are connected by a cable wire. The control circuit and the second external connection terminal EXT2 are connected by a cable wire. This connection makes it possible to connect the power converter 1 and the control circuit by only using two cable wires.

Because conventionally, respective signal terminals and sense source terminals are individually connected to the control circuit by cable wires, six cable wires are needed. However, the power converter 1 according to the first embodiment can be connected to the control circuit by only two cable wires. Therefore, the number of cable wires can be decreased, and the power converter can be downsized accordingly.

Next, operations of the power converter 1 according to the first embodiment are described. The main terminal 10P is connected to a direct-current busbar on the higher-potential side. The main terminal 10N is connected to a direct-current busbar on the lower-potential side. The main terminal 10AC is connected to a load. The control circuit controls the semiconductor element A1 to be switched ON by the first signal terminal GC1, while controlling the semiconductor element B1 to be switched OFF by the third signal terminal GC2, so that the semiconductor element A1 is brought into conduction and a potential of the direct-current busbar on the higher-potential side is applied to the load. Also, the control circuit controls the semiconductor element A1 to be switched OFF by the first signal terminal GC1, while controlling the semiconductor element B1 to be switched ON by the third signal terminal GC2, so that the semiconductor element B1 is brought into conduction and a potential of the direct-current busbar on the lower-potential side is applied to the load. In the manner as described above, the power converter 1 is capable of performing power conversion by switching between a potential of the direct-current busbar on the higher-potential side and a potential of the direct-current busbar on the lower-potential side.

In the first embodiment, the two-level power converter has been described. However, the present invention is also applicable to a three-level power converter.

The power converter 1 according to the first embodiment includes the semiconductor module 10 and the multilayer substrate 30. The semiconductor module 10 includes: the first main terminal 10P; the second main terminal 10N; the third main terminal 10AC; the first semiconductor element A1 in which a drain potential or a collector potential is applied to the first main terminal 10P, a gate potential is applied to the first signal terminal GC1, and a source potential or an emitter potential is applied to the third main terminal 10AC and the second signal terminal SC1; and the second semiconductor element B1 in which a drain potential or a collector potential is applied to the third main terminal 10AC, a gate potential is applied to the third signal terminal GC2, and a source potential or an emitter potential is applied to the second main terminal 10N and the fourth signal terminal SC2, the second semiconductor element B1 is connected in series to the first semiconductor element A1. The multilayer substrate 30 includes: a first wire SUB2_GC1 connected to the first signal terminal GC1; a second wire SUB3_SC1 connected to the second signal terminal SC1; a third wire SUB2_GC2 connected to the third signal terminal GC2; a fourth wire SUB3_SC2 connected to the fourth signal terminal SC2; the first external connection terminal EXT1 to which the first wire SUB2_GC1 and the second wire SUB3_SC1 are connected; and the second external connection terminal EXT2 to which the third wire SUB2_GC2 and the fourth wire SUB3_SC2 are connected, the first wire SUB2_GC1 and the third wire SUB2_GC2 are formed on a first layer with the insulating region SUB2_INS interposed therebetween, the second wire SUB3_SC1 and the fourth wire SUB3_SC2 are formed on a second layer with the insulating region SUB3_INS interposed therebetween. Thus, the number of cable wires connecting to the control circuit can be decreased, and the power converter 1 can be downsized accordingly.

In the power converter 1 according to the first embodiment, the multilayer substrate 30 is located between the third main terminal 10AC and the first main terminal 10p or the second main terminal 10N. Thus, the number of cable wires connecting to the control circuit can be decreased, and the power converter 1 can be downsized accordingly.

In the power converter 1 according to the first embodiment, the first wire SUB2_GC1 and the second wire SUB3_SC1 of the multilayer substrate 30 are formed adjacent to each other, while the third wire SUB2_GC2 and the fourth wire SUB3_SC2 of the multilayer substrate 30 are formed adjacent to each other. Thus, the power converter 1 can be configured to be less affected by noise.

Second Embodiment

Figure 6:
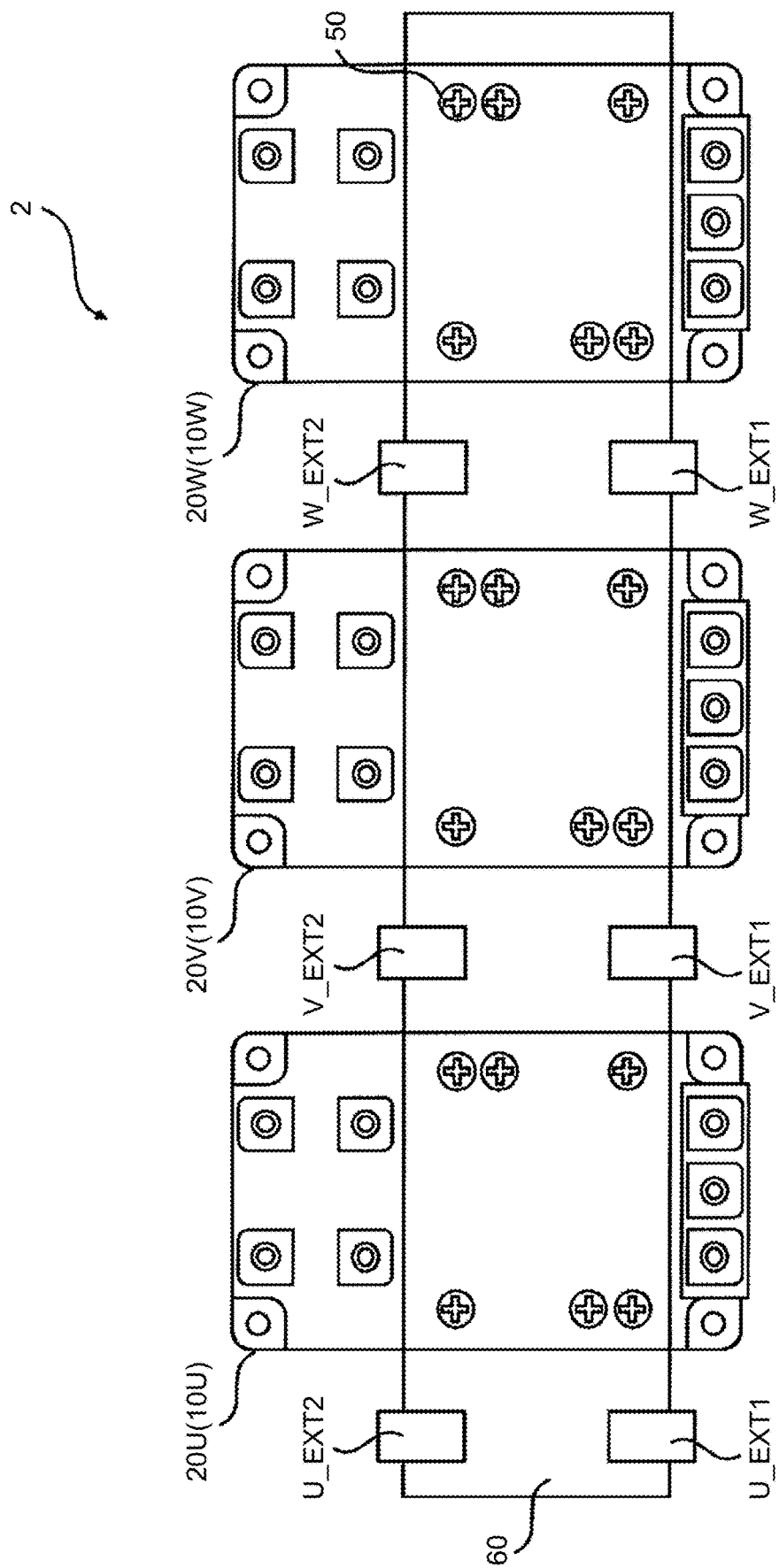
FIG. 6 is a diagram illustrating a power converter 2 according to a second embodiment.

FIG. 6 is a diagram illustrating a power converter 2 according to a second embodiment. The second embodiment is different from the first embodiment in that a plurality of packages and a plurality of external connection terminals are provided.

In FIG. 6, packages 20U, 20V, and 20W are provided. External connection terminals U_EXT1, U_EXT2, V_EXT1, V_EXT2, W_EXT1, and W_EXT2 are also provided. A multilayer substrate 60 is further provided.

The package 20U has a semiconductor module 10U with a U-phase function accommodated in a power conversion circuit. The package 20V has a semiconductor module 10V with a V-phase function accommodated in a power conversion circuit. The package 20W has a semiconductor module 10W with a W-phase function accommodated in a power conversion circuit. The basic configuration of the packages 20U, 20V, and 20W is identical to the configuration of the package 20 according to the first embodiment. The basic configuration of the semiconductor modules 10U, 10V, and 10W is identical to the configuration of the semiconductor module 10 according to the first embodiment.

Similarly to the first embodiment, the packages 20U, 20V, and 20W are electrically connected to the multilayer substrate 60 by the fastening member 50. The packages 20U, 20V, and 20W are located in parallel, and are physically fixed to the multilayer substrate 60 by the fastening member 50. In other words, the semiconductor modules 10U, 10V, and 10W are located in parallel. The phrase "located in parallel" described herein refers to being located such that the main terminals 10P, the main terminals 10N, and the main terminals 10AC of the respective semiconductor modules are adjacent to each other. The package has a generally rectangular shape. Thus, when the packages, each of which has a semiconductor module accommodated therein, are located with their longitudinal sides being parallel to each other, the packages are also described as "located in parallel".

The external connection terminals U_EXT1 and U_EXT2 are external connection terminals for electrically connecting to the package 20U. The external connection terminals V_EXT1 and V_EXT2 are external connection terminals for electrically connecting to the package 20V. The external connection terminals W_EXT1 and W_EXT2 are external connection terminals for electrically connecting to the package 20W. The external connection terminals U_EXT1, U_EXT2, V_EXT1, V_EXT2, W_EXT1, and W_EXT2 are mounted on the multilayer substrate 60. The configuration of these external connection terminals is identical to the configuration of the external connection terminals EXT1 and EXT2 according to the first embodiment.

Figure 7:
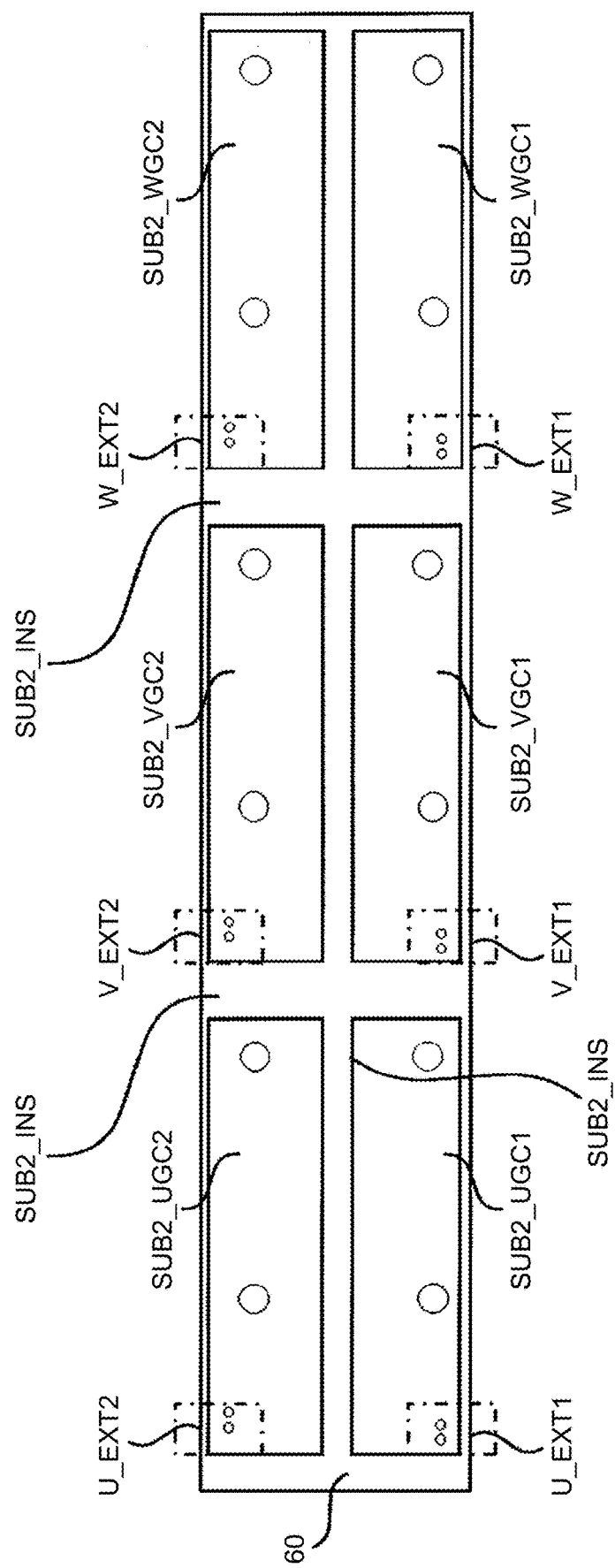
FIG. 7 is a diagram illustrating a pattern example of a second layer of a multilayer substrate used in the power converter 2 according to the second embodiment.

FIG. 7 is a diagram illustrating a pattern example of the second layer of the multilayer substrate 60.

FIG. 7 illustrates the second layer of the multilayer substrate 60, to which: a first signal terminal UGC1 and a third signal terminal UGC2 of the package 20U are electrically connected; a first signal terminal VGC1 and a third signal terminal VGC2 of the package 20V are electrically connected; and a first signal terminal WGC1 and a third signal terminal WGC2 of the package 20W are electrically connected. Specifically, a first signal terminal connection pattern SUB2_UGC1 is electrically connected to the first signal terminal UGC1, and a third signal terminal connection pattern SUB2_UGC2 is electrically connected to the third signal terminal UGC2. A first signal terminal connection pattern SUB2_VGC1 is electrically connected to the first signal terminal VGC1, and a third signal terminal connection pattern SUB2_VGC2 is electrically connected to the third signal terminal VGC2. A first signal terminal connection pattern SUB2_WGC1 is electrically connected to the first signal terminal WGC1, and a third signal terminal connection pattern SUB2_WGC2 is electrically connected to the third signal terminal WGC2.

A conductive member is not formed between the first signal terminal connection pattern SUB2_UGC1 and the third signal terminal connection pattern SUB2_UGC2, between the first signal terminal connection pattern SUB2_VGC1 and the third signal terminal connection pattern SUB2_VGC2, or between the first signal terminal connection pattern SUB2_WGC1 and the third signal terminal connection pattern SUB2_WGC2. However, the insulating region SUB2_INS is formed therebetween. The insulating region SUB2_INS is formed to ensure electrical insulation between the first signal terminal connection pattern and the third signal terminal connection pattern.

A conductive member is not formed between the first signal terminal connection pattern SUB2_UGC1 and the first signal terminal connection pattern SUB2_VGC1 or between the first signal terminal connection pattern SUB2_VGC1 and the first signal terminal connection pattern SUB2_WGC1. However, the insulating region SUB2_INS is formed therebetween. The insulating region SUB2_INS is formed to ensure electrical insulation between a U-phase first signal terminal connection pattern and a V-phase first signal terminal connection pattern, and to ensure electrical insulation between the V-phase first signal terminal connection pattern and a W-phase first signal terminal connection pattern.

Similarly, a conductive member is not formed between the third signal terminal connection pattern SUB2_UGC2 and the third signal terminal connection pattern SUB2_VGC2 or between the third signal terminal connection pattern SUB2_VGC2 and the third signal terminal connection pattern SUB2_WGC2. However, the insulating region SUB2_INS is formed therebetween. The insulating region SUB2_INS is formed to ensure electrical insulation between a U-phase third signal terminal connection pattern and a V-phase third signal terminal connection pattern, and to ensure electrical insulation between the V-phase third signal terminal connection pattern and a W-phase third signal terminal connection pattern.

Similarly to the second layer of the multilayer substrate 60 illustrated in FIG. 7, electrical insulation between the U-phase, the V-phase, and the W-phase is also ensured on the third layer and the fourth layer (both not illustrated).

The multilayer substrate 60 used in the power converter 2 is provided with an insulating region so as to form wires at the same electrical potential on the same layer. This eliminates the need for separating the layers from each other for individual signal terminals, and thus facilitates design of the multilayer substrate 60. Even in a case where there are a plurality of semiconductor modules, it is still unnecessary to increase the number of layers of the multilayer substrate 60. This facilitates design of the multilayer substrate 60. Because it is unnecessary to increase the number of layers of the multilayer substrate 60, the power converter 2 achieves a cost reduction effect.

As illustrated in FIG. 6, in the power converter 2 according to the second embodiment, the semiconductor modules 10U, 10V, and 10W are located in parallel and connected by the multilayer substrate 60. Because conventionally, respective signal terminals and sense source terminals of each semiconductor module are individually connected to the control circuit by cable wires, six cable wires are needed for each semiconductor module. Further, in the case of a three-phase two-level inverter circuit in which there are semiconductor modules for three phases, a total of 18 cable wires are needed. However, it is sufficient for the power converter 2 according to the second embodiment to use cable wires equal to the number of external connection terminals. That is, the power converter 2 according to the second embodiment can be connected to the control circuit by a total of six cable wires. Therefore, the number of cable wires can be decreased, and the power converter can be downsized accordingly.

Next, operations of the power converter 2 according to the second embodiment are described. The control circuit controls the semiconductor module 10U by using the first signal terminal GC1 and the third signal terminal GC2 of the semiconductor module 10U. The control circuit controls the semiconductor module 10V by using the first signal terminal GC1 and the third signal terminal GC2 of the semiconductor module 10V. The control circuit controls the semiconductor module 10W by using the first signal terminal GC1 and the third signal terminal GC2 of the semiconductor module 10W. The control circuit controls the semiconductor modules 10U, 10V, and 10W by a 120-degree phase shift, so that it is possible to control three phases including the U-phase, the V-phase, and the W-phase.

The power converter 2 according to the second embodiment includes a plurality of the semiconductor modules, in which a first semiconductor module and a second semiconductor module are located in parallel such that the first main terminals 10P, the second main terminals 10N, and the third main terminals 10AC of the first semiconductor module and the second semiconductor module are adjacent to each other. Thus, the number of cable wires connecting to the control circuit can be decreased, and the power converter can be downsized accordingly.

Third Embodiment

Figure 8:
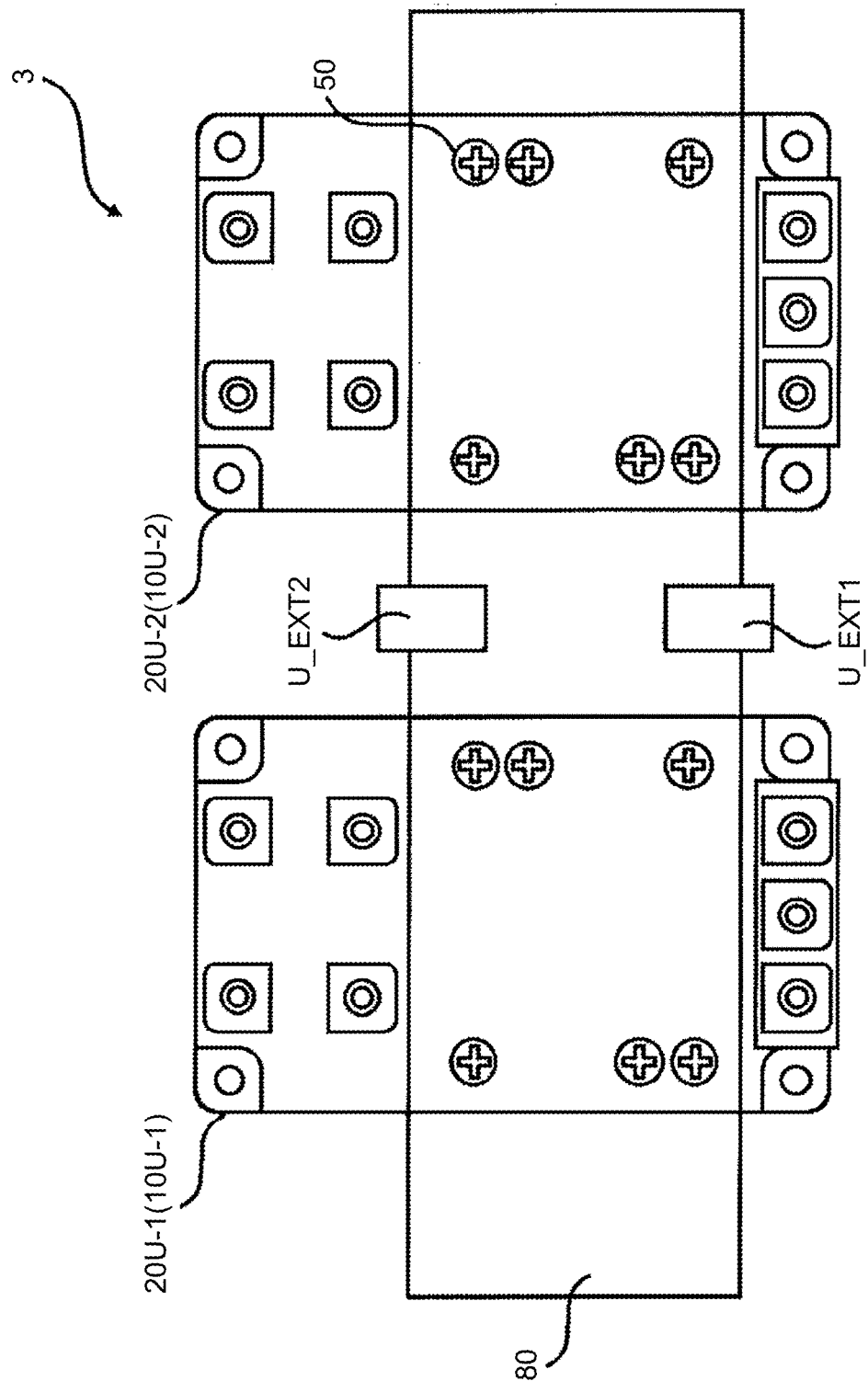
FIG. 8 is a diagram illustrating a power converter 3 according to a third embodiment.

FIG. 8 is a diagram illustrating a power converter 3 according to a third embodiment. In FIG. 8, packages 20U-1 and 20U-2 are provided in parallel. The external connection terminals U_EXT1 and U_EXT2 are also provided. A multilayer substrate 80 is further provided. The packages 20U-1 and 20U-2 respectively have semiconductor modules 10U-1 and 10U-2 with a U-phase function accommodated in a power conversion circuit. That is, the semiconductor modules 10U-1 and 10U-2 are provided in parallel. The basic configuration of the packages 20U-1 and 20U-2 is identical to the configuration of the package 20 according to the first embodiment. The basic configuration of the semiconductor modules 10U-1 and 10U-2 is identical to the configuration of the semiconductor module 10 according to the first embodiment.

In FIG. 8, the external connection terminals U-EXT1 and U-EXT2 are provided between the packages 20U-1 and 20U-2, which are provided in parallel. The external connection terminals U_EXT1 and U_EXT2 are mounted on the multilayer substrate 80. The packages 20U-1 and 20U-2 provided in parallel are electrically connected to the multilayer substrate 80 by the fastening member 50. The packages 20U-1 and 20U-2 are located in parallel, and are physically fixed to the multilayer substrate 80 by the fastening member 50.

Figure 9:
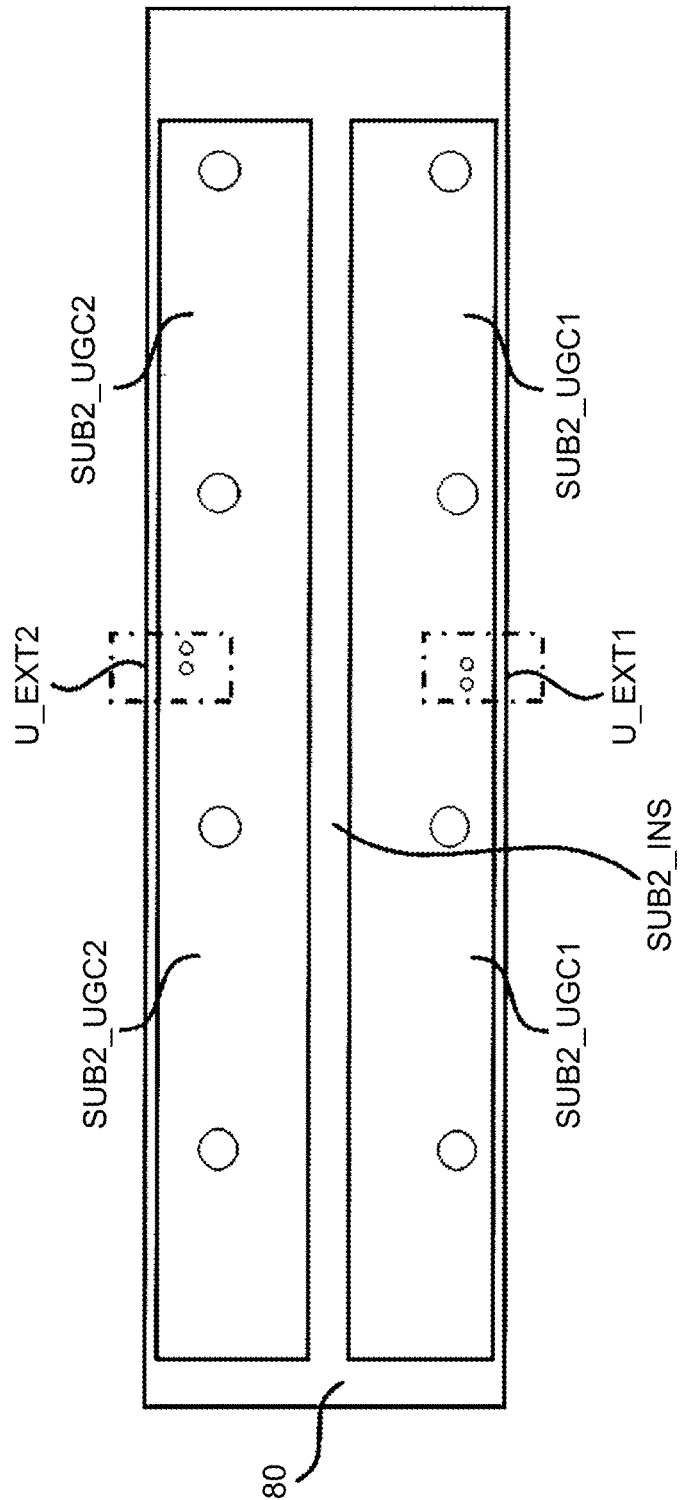
FIG. 9 is a diagram illustrating a pattern example of a second layer of a multilayer substrate used in the power converter 3 according to the third embodiment.

FIG. 9 is a diagram illustrating a pattern example of the second layer of the multilayer substrate 80. FIG. 9 illustrates the second layer of the multilayer substrate 80, to which the first signal terminal UGC1 and the third signal terminal UGC2 of the packages 20U-1 and 20U-2 are electrically connected. Specifically, the first signal terminal connection pattern SUB2_UGC1 is electrically connected to the first signal terminal UGC1, and the third signal terminal connection pattern SUB2_UGC2 is electrically connected to the third signal terminal UGC2.

Between the first signal terminal connection pattern SUB2_UGC1 and the third signal terminal connection pattern SUB2_UGC2, a conductive member is not formed, but the insulating region SUB2_INS is formed. The insulating region SUB2_INS is formed to ensure electrical insulation between the first signal terminal connection pattern and the third signal terminal connection pattern.

The first signal terminals UGC1 of the package 20U-1 and the package 20U-2 located in parallel are both connected to the second layer of the multilayer substrate 80, and therefore have the same electrical potential. In the same manner as described above, the third signal terminals UGC2 of the package 20U-1 and the package 20U-2 located in parallel are both connected to the second layer of the multilayer substrate 80, and therefore have the same electrical potential. Similarly to the second layer of the multilayer substrate 80 illustrated in FIG. 9, the third layer and the fourth layer (both not illustrated) are also connected to the packages 20U-1 and 20U-2 located in parallel, and thus the signal terminals on each layer have the same electrical potential.

In other words, the first signal terminal UGC1 of the semiconductor module 10U-1 and the first signal terminal UGC1 of the semiconductor module 10U-2 are both connected to the second layer of the multilayer substrate 80, and therefore have the same electrical potential. In the same manner as described above, the third signal terminals UGC2 of the semiconductor modules 10U-1 and 10U-2 located in parallel are both connected to the second layer of the multilayer substrate 80, and therefore have the same electrical potential. Similarly to the second layer of the multilayer substrate 80 illustrated in FIG. 9, the third layer and the fourth layer (both not illustrated) are also connected to the semiconductor modules 10U-1 and 10U-2, and thus the signal terminals on each layer have the same electrical potential.

The sense source terminals SS1 and SS2 of the semiconductor module 10U-1 or the semiconductor module 10U-2 function properly as far as one of the semiconductor module 10U-1 and the semiconductor module 10U-2 is connected to the multilayer substrate.

In FIG. 8, the external connection terminal U_EXT1 is provided between the packages 20U-1 and 20U-2 located in parallel, so as to reduce the difference between the wire distance from the first signal terminal of the package 20U-1 to the external connection terminal U_EXT1 and the wire distance from the first signal terminal of the package 20U-2 to the external connection terminal U_EXT1. The same applies to the second signal terminals of the packages 20U-1 and 20U-2. In addition, the external connection terminal U_EXT2 is provided between the packages 20U-1 and 20U-2 located in parallel, so as to reduce the difference between the wire distance from the third signal terminal of the package 20U-1 to the external connection terminal U_EXT2 and the wire distance from the third signal terminal of the package 20U-2 to the external connection terminal U_EXT2. The same applies to the fourth signal terminals of the packages 20U-1 and 20U-2.

As illustrated in FIG. 8, in the power converter 3 according to the third embodiment, the packages 20U-1 and 20U-2 are located in parallel and connected to the multilayer substrate 80. Because conventionally, respective signal terminals and sense source terminals of each semiconductor module are individually connected to the control circuit by cable wires, six cable wires are needed for each semiconductor module. Further, in a case where two semiconductor modules for the same phase are located, a total of 12 cable wires are needed. However, it is sufficient for the power converter 3 according to the third embodiment to use cable wires equal to the number of external connection terminals. That is, the power converter 3 according to the third embodiment can be connected to the control circuit by only two cable wires. Therefore, the number of cable wires can be decreased, and the power converter can be downsized accordingly.

In the conventional case where terminals at the same electrical potential are wired, because the terminals are connected to a control circuit by cable wires, there are variations in wire length. Problems due to the occurrence of variations in wire length are explained below.

For example, a case is considered where the U-phase upper arm is controlled by controlling a semiconductor element A1 that is an upper arm of the semiconductor module 10U1 and a semiconductor element A2 that is an upper arm of the semiconductor module 10U-2. The semiconductor element A1 and the semiconductor element A2 both constitute the U-phase upper arm, and thus have the same function. The control circuit controls the semiconductor element A1 and the semiconductor element A2 at the same timing. Although the control circuit outputs a signal to the semiconductor elements A1 and A2 at the same timing, if the length of the cable wire between the control circuit and the semiconductor element A1 differs from the length of the cable wire between the control circuit and the semiconductor element A2, this causes a time lag in inputting a signal to the control terminals of the semiconductor element A1 and the semiconductor element A2. Due to the time lag, the semiconductor element A1 and the semiconductor element A2 are switched ON/OFF at an improper timing. When the semiconductor element A1 and the semiconductor element A2 are switched ON/OFF at an improper timing, a high current flows instantaneously through either semiconductor element, whichever is switched ON earlier, for example. This increases the amount of heat generated. The increase in the amount of heat generated leads to a problem that one of the semiconductor elements is more likely to be degraded.

However, in the power converter 3 according to the third embodiment, when the terminals at the same electrical potential are wired, a cable wire for connecting to the control circuit is common between the semiconductor elements. Thus, there are not variations in wire length due to the cable wire. Because there are not variations in wire length due to the cable wire, the power converter 3 achieves an effect of avoiding the problem that one of the semiconductor elements is more likely to be degraded.

Figure 10:
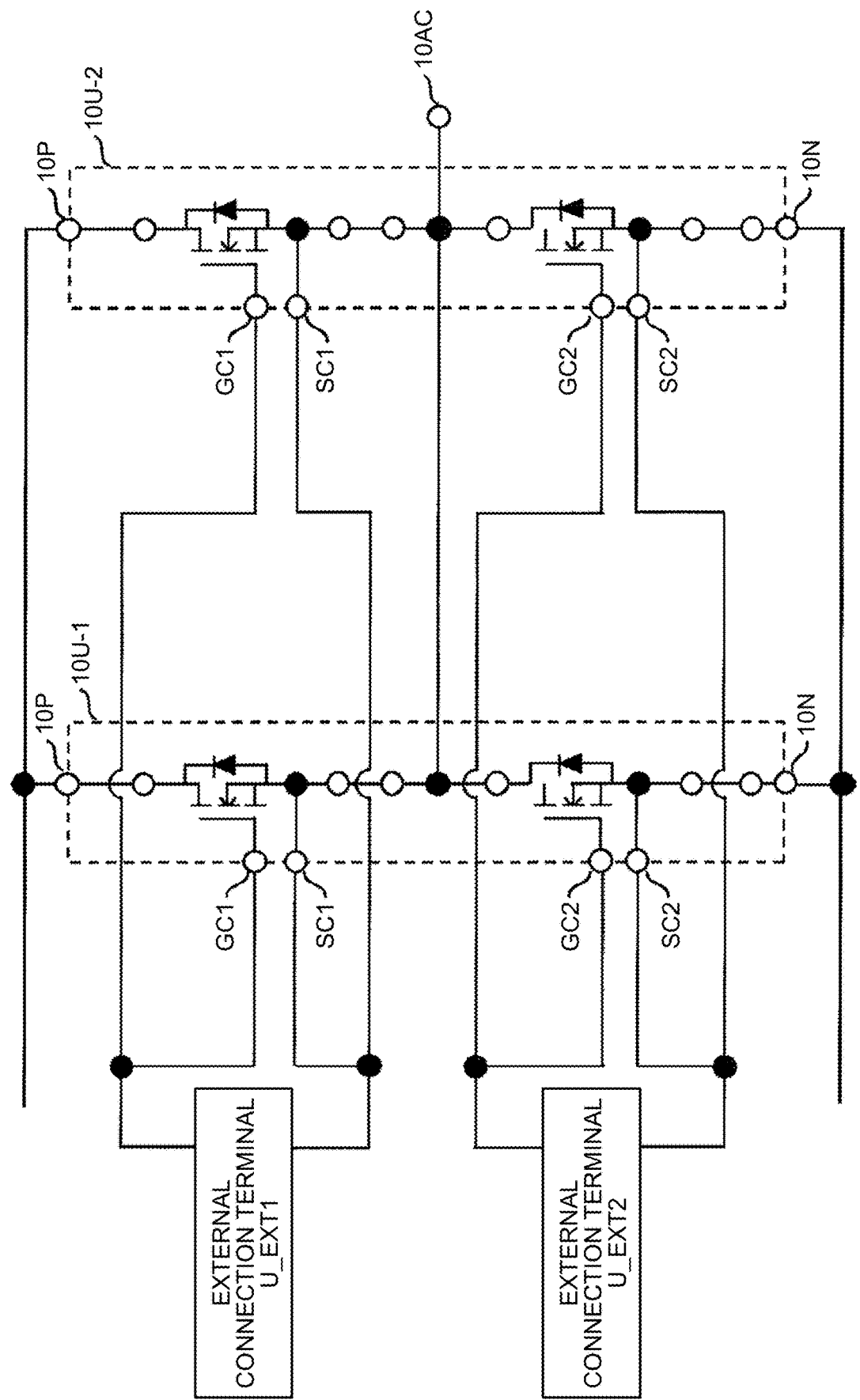
FIG. 10 is a circuit diagram illustrating a configuration of essential parts of the power converter 3 according to the third embodiment.

FIG. 10 is a circuit diagram illustrating a configuration of essential parts of the power converter 3 according to the third embodiment. In FIG. 10, the first signal terminal GC1 of the semiconductor module 10U-1 is connected to the first signal terminal GC1 of the semiconductor module 10U-2 and connected to the external connection terminal U_EXT1. The second signal terminal SC1 of the semiconductor module 10U-1 is connected to the second signal terminal SC1 of the semiconductor module 10U-2 and connected to the external connection terminal U_EXT1. The third signal terminal GC2 of the semiconductor module 10U-1 is connected to the third signal terminal GC2 of the semiconductor module 10U-2 and connected to the external connection terminal U_EXT2. The fourth signal terminal SC2 of the semiconductor module 10U-1 is connected to the fourth signal terminal SC2 of the semiconductor module 10U-2 and connected to the external connection terminal U_EXT2.

The first signal terminal GC1 of the semiconductor module 10U-1, the first signal terminal GC1 of the semiconductor module 10U-2, and the external connection terminal U_EXT1 are connected, so that the control circuit can control the semiconductor modules 10U-1 and 10U-2 at the same timing.

In the third embodiment, the semiconductor module with the U-phase function has been described. It is also possible for a semiconductor module with the V-phase function and a semiconductor module with the W-phase function to be configured identically to the semiconductor module with the U-phase function. In the third embodiment, the case has been described where two semiconductor modules are located in parallel. It is also allowable that three or more semiconductor modules are located in parallel.

The multilayer substrate 80 used in the power converter 3 is provided with an insulating region so as to form wires at the same electrical potential on the same layer. This eliminates the need for separating the layers from each other for individual signal terminals, and thus facilitates design of the multilayer substrate 80. Even in a case where there are a plurality of semiconductor modules, it is still unnecessary to increase the number of layers of the multilayer substrate 80. This facilitates design of the multilayer substrate 80. Because it is unnecessary to increase the number of layers of the multilayer substrate 80, the power converter 3 achieves a cost reduction effect.

In the power converter 3 according to the third embodiment, the first semiconductor module and second semiconductor module located in parallel are of the same phase. Thus, the number of cable wires connecting to the control circuit can be decreased, and the power converter can be downsized accordingly.

In the power converter 3 according to the third embodiment, first signal terminals of the first semiconductor module and the second semiconductor module have the same electrical potential, second signal terminals of the first semiconductor module and the second semiconductor module have the same electrical potential, third signal terminals of the first semiconductor module and the second semiconductor module have the same electrical potential, and fourth signal terminals of the first semiconductor module and the second semiconductor module have the same electrical potential. Thus, the number of cable wires connecting to the control circuit can be decreased, and the power converter can be downsized accordingly.

In the power converter 3 according to the third embodiment, the first external connection terminal and the second external connection terminal are located between the first semiconductor module and second semiconductor module located in parallel. This can reduce the difference between the wire distance from the first semiconductor module to the first external connection terminal and the wire distance from the second semiconductor module to the first external connection terminal, and can reduce the difference between the wire distance from the first semiconductor module to the second external connection terminal and the wire distance from the second semiconductor module to the second external connection terminal.

Fourth Embodiment

Figure 11:
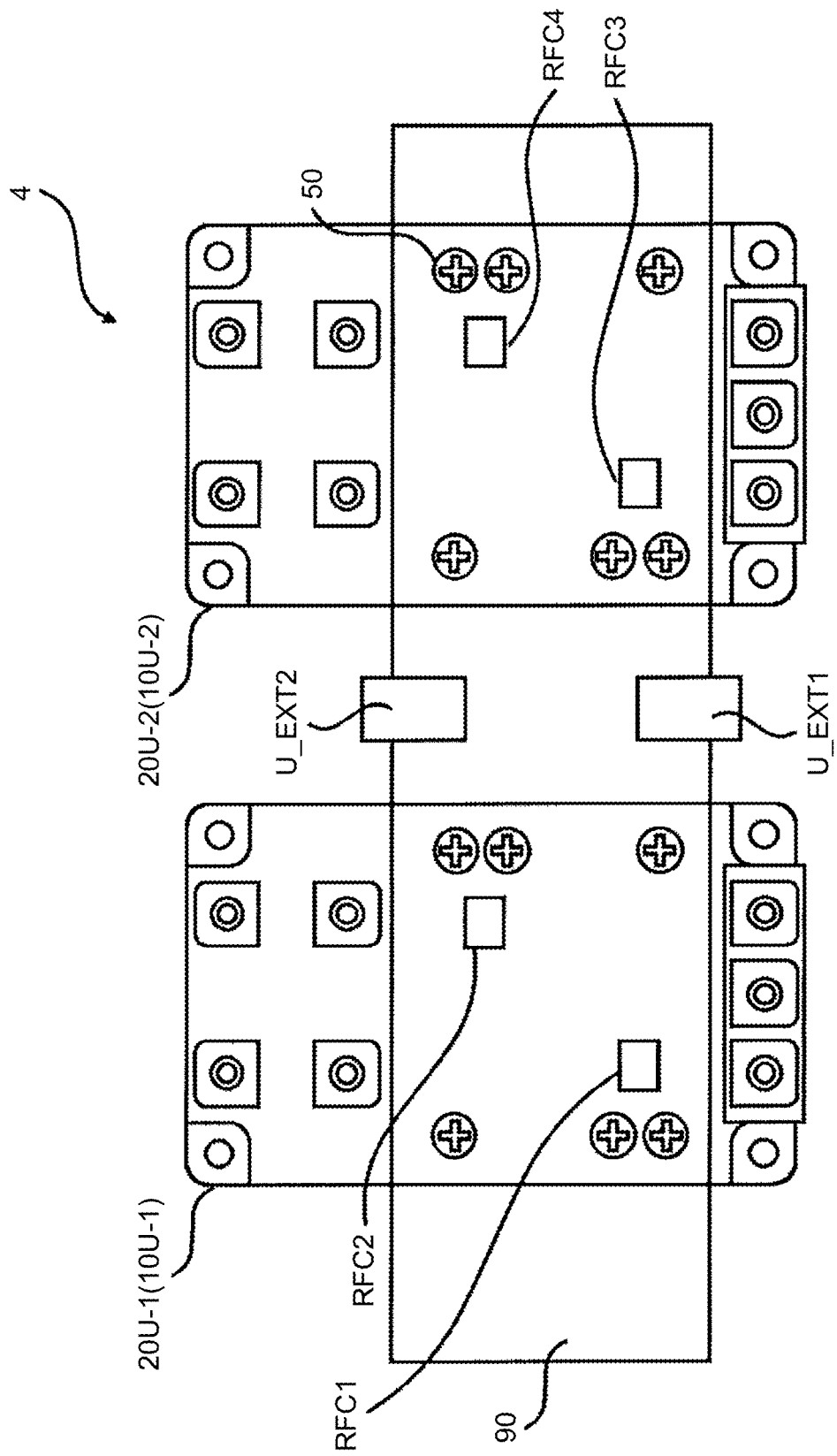
FIG. 11 is a diagram illustrating a power converter 4 according to a fourth embodiment.

FIG. 11 is a diagram illustrating a power converter 4 according to a fourth embodiment. In the fourth embodiment, choke coils RFC1 to RFC4 are provided in addition to the configuration according to the third embodiment. In FIG. 11, the packages 20U-1 and 20U-2 are provided in parallel. The external connection terminals U_EXT1 and U_EXT2 are also provided. A multilayer substrate 90 is further provided. The packages 20U-1 and 20U-2 respectively have the semiconductor modules 10U-1 and 10U-2 with the U-phase function accommodated in a power conversion circuit. That is, the semiconductor modules 10U-1 and 10U-2 are provided in parallel. The basic configuration of the packages 20U-1 and 20U-2 is identical to the configuration of the package 20 according to the first embodiment. The basic configuration of the semiconductor modules 10U-1 and 10U-2 is identical to the configuration of the semiconductor module 10 according to the first embodiment.

In FIG. 11, the packages 20U-1 and 20U-2 provided in parallel are electrically connected to the multilayer substrate 90 by the fastening member 50. The packages 20U-1 and 20U-2 are located in parallel, and are physically fixed to the multilayer substrate 90 by the fastening member 50.

The choke coils RFC1 to RFC4 are mounted on the multilayer substrate 90, and have a function of minimizing a high-frequency current such as common-mode noise. When the choke coils RFC1 to RFC4 are not distinguished from each other, these coils are sometimes referred collectively to as "choke coil RFC".

Each of the choke coils RFC1 to RFC4 has a structure, for example, in which two conductive wires are wound around a single core, and has four terminals. The two conductive wires are wound in opposite directions to each other. Each of the choke coils RFC1 to RFC4 serves as an inductor for a high-frequency current that is common-mode noise, and has a function of minimizing the high-frequency current by using a higher resistance.

A first terminal of the choke coil RFC1 is connected to the first signal terminal of the package 20U-1. A second terminal of the choke coil RFC1 is connected to the second signal terminal of the package 20U-1. A third terminal and a fourth terminal of the choke coil RFC1 are connected to the external connection terminal U_EXT1.

A first terminal of the choke coil RFC2 is connected to the third signal terminal of the package 20U-1. A second terminal of the choke coil RFC2 is connected to the fourth signal terminal of the package 20U-1. A third terminal and a fourth terminal of the choke coil RFC2 are connected to the external connection terminal U_EXT2.

A first terminal of the choke coil RFC3 is connected to the first signal terminal of the package 20U-2. A second terminal of the choke coil RFC3 is connected to the second signal terminal of the package 20U-2. A third terminal and a fourth terminal of the choke coil RFC3 are connected to the external connection terminal U_EXT1.

A first terminal of the choke coil RFC4 is connected to the third signal terminal of the package 20U-2. A second terminal of the choke coil RFC4 is connected to the fourth signal terminal of the package 20U-2. A third terminal and a fourth terminal of the choke coil RFC4 are connected to the external connection terminal U_EXT2.

Figure 12:
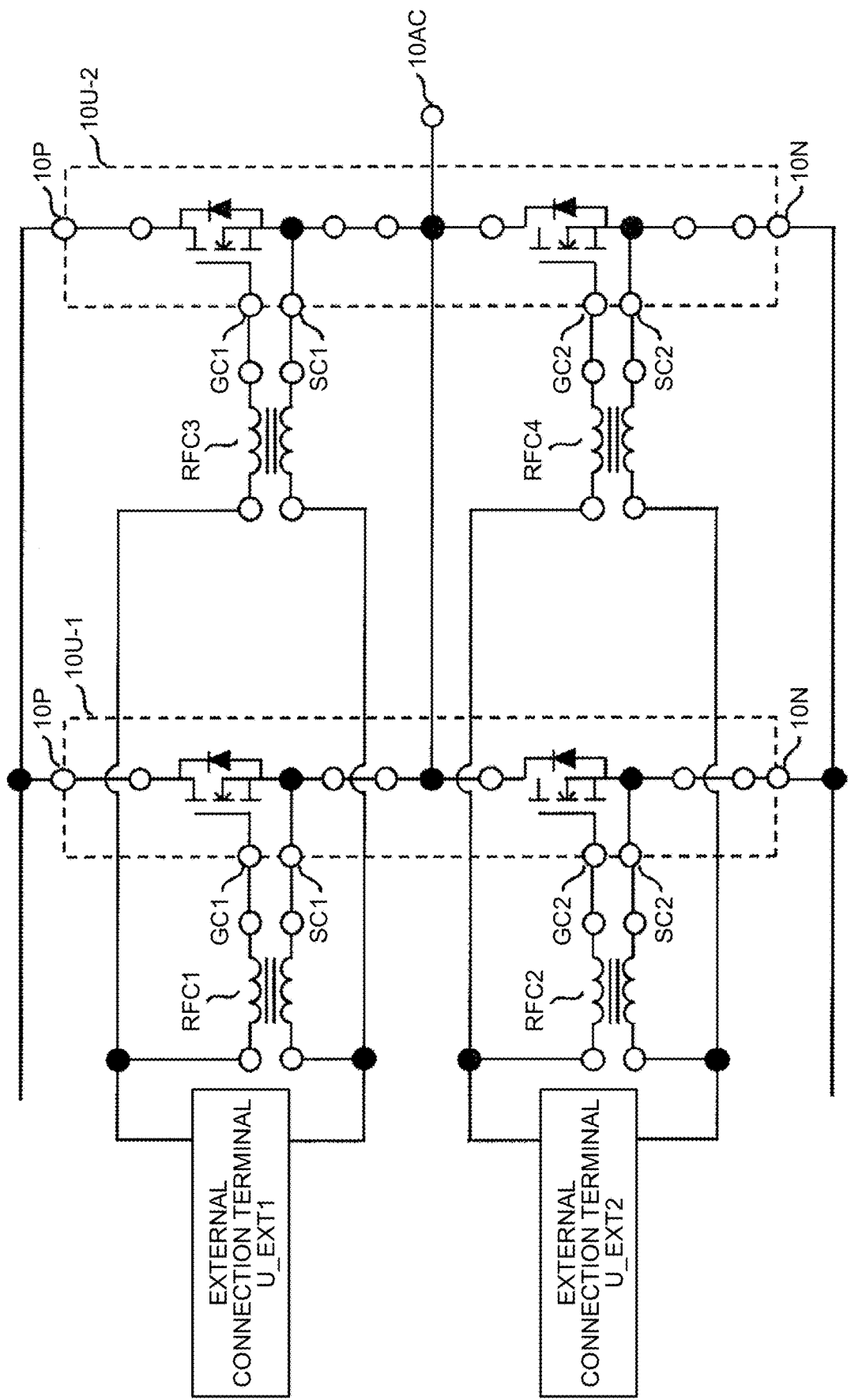
FIG. 12 is a circuit diagram illustrating a configuration of essential parts of the power converter 4 according to the fourth embodiment.

FIG. 12 is a circuit diagram illustrating a configuration of essential parts of the power converter 4 according to the fourth embodiment. In FIG. 12, the first to fourth signal terminals of the semiconductor modules 10U-1 and 10U-2, and the choke coils RFC1 to RFC4 are connected.

In FIG. 12, the first terminal of the choke coil RFC1 is connected to the first signal terminal of the semiconductor module 10U-1. The second terminal of the choke coil RFC1 is connected to the second signal terminal of the semiconductor module 10U-1. The third terminal of the choke coil RFC1 is connected to the third terminal of the choke coil RFC3 and the external connection terminal U_EXT1. The fourth terminal of the choke coil RFC1 is connected to the fourth terminal of the choke coil RFC3 and the external connection terminal U_EXT1.

The first terminal of the choke coil RFC2 is connected to the third signal terminal of the semiconductor module 10U-1. The second terminal of the choke coil RFC2 is connected to the fourth signal terminal of the semiconductor module 10U-1. The third terminal of the choke coil RFC2 is connected to the third terminal of the choke coil RFC4 and the external connection terminal U_EXT2. The fourth terminal of the choke coil RFC2 is connected to the fourth terminal of the choke coil RFC4 and the external connection terminal U_EXT2.

The first terminal of the choke coil RFC3 is connected to the first signal terminal of the semiconductor module 10U-2. The second terminal of the choke coil RFC3 is connected to the second signal terminal of the semiconductor module 10U-2. The third terminal of the choke coil RFC3 is connected to the third terminal of the choke coil RFC1 and the external connection terminal U_EXT1. The fourth terminal of the choke coil RFC3 is connected to the fourth terminal of the choke coil RFC1 and the external connection terminal U_EXT1.

The first terminal of the choke coil RFC4 is connected to the third signal terminal of the semiconductor module 10U-2. The second terminal of the choke coil RFC4 is connected to the fourth signal terminal of the semiconductor module 10U-2. The third terminal of the choke coil RFC4 is connected to the third terminal of the choke coil RFC2 and the external connection terminal U_EXT2. The fourth terminal of the choke coil RFC4 is connected to the fourth terminal of the choke coil RFC2 and the external connection terminal U_EXT2.

As described above, the first to fourth signal terminals and the choke coils RFC1 to RFC4 are connected, so that it is possible to minimize an oscillating current to be described later.

In semiconductor modules connected in parallel, when switching of the semiconductor modules is performed, specifically, when the semiconductor modules are switched between ON and OFF, an oscillating current in parallel connection may be generated. Because the gate potentials (the source potentials) connected in parallel have the same electrical potential therebetween and have a low resistance, an oscillating current in parallel connection is more likely to be generated. This may cause an incorrect switching operation to be performed on the semiconductor modules.

Figure 13:
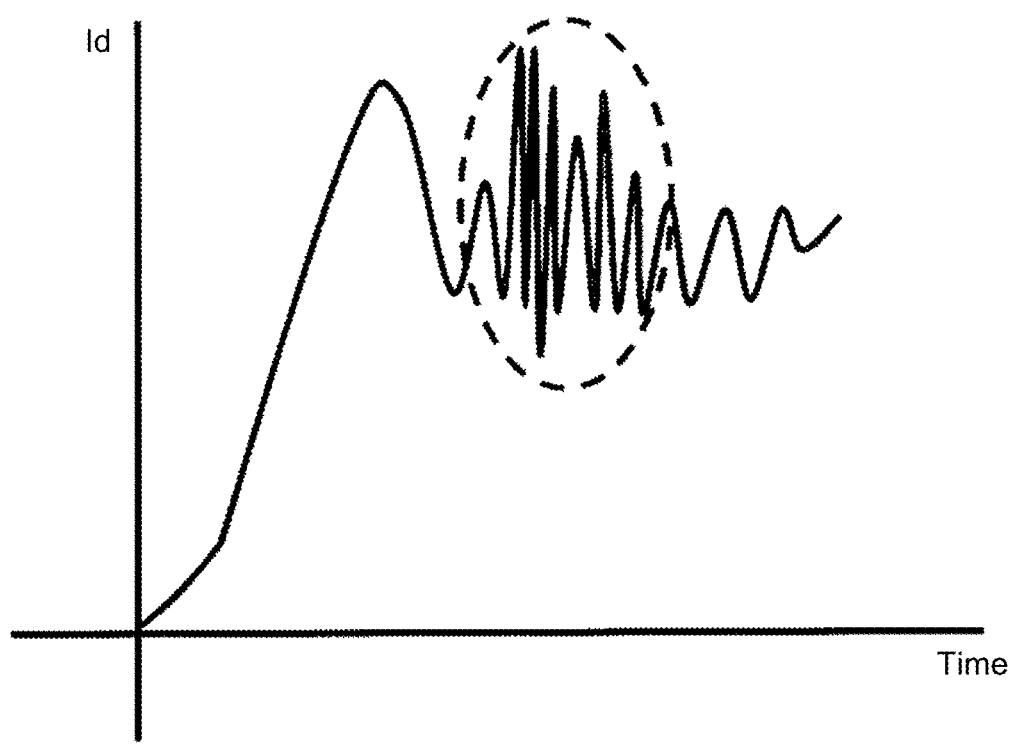
FIG. 13 is a diagram illustrating an example of an oscillating current in parallel connection.

FIG. 13 is a diagram illustrating an example of the oscillating current in parallel connection. FIG. 13 is a diagram illustrating an oscillating current that is generated when a transistor of the semiconductor module is switched ON, in which the vertical axis represents a drain current Id, while the horizontal axis represents Time.

That is, FIG. 13 is a diagram illustrating variations in the drain current that flows through the transistor of the semiconductor module over time. After the transistor is switched ON, a short-cycle current, that is, a high-frequency current may flow as illustrated in the section surrounded by the dotted line in FIG. 13, which is an oscillating current.

The power converter 4 according to the fourth embodiment is configured to provide the choke coils RFC1 to RFC4 for the first to fourth signal terminals. The choke coils RFC1 to RFC4 function as a high resistance for a high-frequency current, and thus minimize an input of the high-frequency current to the first to fourth signal terminals. That is, the oscillating current can be minimized by providing the choke coils RFC1 to RFC4 at the input unit of the first to fourth signal terminals.

It suffices that the choke coil RFC is provided at least at a location between an external connection terminal and a semiconductor element. It is also possible that the choke coil RFC is provided in either the upper arm or the lower arm. However, in order to efficiently minimize the oscillating current, it is more preferable to provide the choke coil RFC for the signal terminals of each semiconductor element as illustrated in FIG. 12. It is more preferable to provide the choke coil RFC at a location closer to the signal terminals of each semiconductor element.

In the fourth embodiment, the semiconductor module with the U-phase function has been described. It is also possible for a semiconductor module with the V-phase function and a semiconductor module with the W-phase function to be configured identically to the semiconductor module with the U-phase function. In the fourth embodiment, the power converter 4 using a choke coil has been described as an example. However, a common mode filter or the like may also be used.

The power converter 4 according to the fourth embodiment includes, on the multilayer substrate 90, the choke coil RFC including first to fourth terminals, the first terminal and the second terminal being connected to the first semiconductor element A1 or the second semiconductor element B1, the third terminal and the fourth terminal being connected to the first external connection terminal or the second external connection terminal. This can minimize an oscillating current to be input to the first semiconductor element A1 or the second semiconductor element B1.

The power converter 4 according to the fourth embodiment includes a first choke coil and a second choke coil, on the multilayer substrate 9. In the first choke coil, a first terminal is connected to the first signal terminal, a second terminal is connected to the second signal terminal, and a third terminal and a fourth terminal are connected to the first external connection terminal. In the second choke coil, a first terminal is connected to the third signal terminal, a second terminal is connected to the fourth signal terminal, and a third terminal and a fourth terminal are connected to the second external connection terminal. This can minimize an oscillating current to be input to the semiconductor element A1 and the semiconductor element B1 which constitute the semiconductor module.

The power converter 4 according to the fourth embodiment includes the first semiconductor module and the second semiconductor module. The power converter 4 also includes, on the multilayer substrate 90, a third choke coil and a fourth choke coil. In the third choke coil a first terminal is connected to a first signal terminal of the first semiconductor module, a second terminal is connected to a second signal terminal of the first semiconductor module, and a third terminal and a fourth terminal are connected to the first external connection terminal. In the fourth choke coil a first terminal is connected to a first signal terminal of the second semiconductor module, a second terminal is connected to a second signal terminal of the second semiconductor module, and a third terminal and a fourth terminal are connected to the first external connection terminal. This can minimize an oscillating current to be input to the semiconductor element A1 constituting the upper arm of the semiconductor modules 10U-1 and 10U-2.

The power converter 4 according to the fourth embodiment includes the first semiconductor module and the second semiconductor module. The power converter 4 also includes, on the multilayer substrate 90, a fifth choke coil and a sixth choke coil. In the fifth choke coil a first terminal is connected to a third signal terminal of the first semiconductor module, a second terminal is connected to a fourth signal terminal of the first semiconductor module, and a third terminal and a fourth terminal are connected to the second external connection terminal. In the sixth choke coil a first terminal is connected to a third signal terminal of the second semiconductor module, a second terminal is connected to a fourth signal terminal of the second semiconductor module, and a third terminal and a fourth terminal are connected to the second external connection terminal. This can minimize an oscillating current to be input to the semiconductor element B1 constituting the lower arm of the semiconductor modules 10U-1 and 10U-2.

In the present invention, within the scope of the invention, the respective embodiments can be combined with one another arbitrarily, or these embodiments can be modified or omitted as appropriate.

REFERENCE SIGNS LIST 1, 2, 3, 4 power converter
D1, D2 drain terminal
S1, S2 source terminal
GC1, GC2 gate control terminal
SC1, SC2 source control terminal
SS1, SS2 sense source terminal
A1 first semiconductor element
B1 second semiconductor element
10P first main terminal
10N second main terminal
10AC third main terminal
10, 10U, 10U-1, 10U-2, 10V, 10W semiconductor module
20, 20U, 20U-1, 20U-2, 20V, 20W package
30, 60, 80, 90 multilayer substrate
EXT1, EXT2, U_EXT1, U_EXT2, V_EXT1, V_EXT2, W_EXT1, W_EXT2 external connection terminal
SUB1_GC1, SUB1_GC2, SUB1_SC1, SUB1_SC2, SUB1_SS1, SUB1_SS2, SUB2_GC1, SUB2_GC2, SUB3_SC1, SUBS SC2, SUB4_SS1, SUB4_SS2, SUB2_UGC1, SUB2_UGC2, SUB2_VGC1, SUB2_VGC2, SUB2_WGC1, SUB2_WGC2 signal terminal connection pattern
50, 50GC1, 50GC2, 50SC1, 50SC2, 50SS1, 50SS2 fastening member
SUB2_INS, SUB3_INS, SUB4_INS insulating region
RFC1, RFC2, RFC3, RFC4 choke coil
TH2, TH3, TH4 through hole

The invention claimed is:

1. A power converter comprising:
a semiconductor module including,
a first main terminal, a second main terminal, and a third main terminal,
a first semiconductor element in which a drain terminal or a collector terminal is connected to the first main terminal, a gate terminal is connected to a first signal terminal, and a source terminal or an emitter terminal is connected to the third main terminal and a second signal terminal, and
a second semiconductor element in which another drain terminal or another collector terminal is connected to the third main terminal, another gate terminal is connected to a third signal terminal, and another source terminal or another emitter terminal is connected to the second main terminal and a fourth signal terminal, the second semiconductor element being connected in series to the first semiconductor element; and
a multilayer substrate including
a first wire connected to the first signal terminal,
a second wire connected to the second signal terminal,
a third wire connected to the third signal terminal,
a fourth wire connected to the fourth signal terminal,
a first external connection terminal to which the first wire and the second wire are connected, and
a second external connection terminal to which the third wire and the fourth wire are connected,
the first wire and the third wire being formed on a first layer with an insulating region interposed therebetween,
the second wire and the fourth wire being formed on a second layer with an insulating region interposed therebetween.

2. The power converter according to claim 1, wherein the multilayer substrate is located between the third main terminal and the first main terminal or the second main terminal.

3. The power converter according to claim 1, comprising a plurality of the semiconductor modules, wherein
a first semiconductor module and a second semiconductor module are located in parallel such that the first main terminals, the second main terminals, and the third main terminals of the first semiconductor module and the second semiconductor module are adjacent to each other.

4. The power converter according to claim 3, wherein the first semiconductor module and second semiconductor module located in parallel are of a same phase.

5. The power converter according to claim 4 wherein
first signal terminals of the first semiconductor module and second semiconductor module have a same electrical potential,
second signal terminals of the first semiconductor module and second semiconductor module have a same electrical potential,
third signal terminals of the first semiconductor module and second semiconductor module have a same electrical potential, and
fourth signal terminals of the first semiconductor module and second semiconductor module have a same electrical potential.

6. The power converter according to claim 3, wherein the first external connection terminal and the second external connection terminal are located between the first semiconductor module and second semiconductor module located in parallel.

7. The power converter according to claim 1, comprising, on the multilayer substrate,
a choke coil including first to fourth terminals,
the first terminal and the second terminal being connected to the first semiconductor element or the second semiconductor element,
the third terminal and the fourth terminal being connected to the first external connection terminal or the second external connection terminal.

8. The power converter according to claim 7, comprising: on the multilayer substrate,
a first choke coil in which a first terminal is connected to the first signal terminal, a second terminal is connected to the second signal terminal, and a third terminal and a fourth terminal are connected to the first external connection terminal; and
a second choke coil in which a first terminal is connected to the third signal terminal, a second terminal is connected to the fourth signal terminal, and a third terminal and a fourth terminal are connected to the second external connection terminal.

9. The power converter according to claim 7, comprising the first semiconductor module and the second semiconductor module, wherein
the power converter comprises: on the multilayer substrate,
a third choke coil in which a first terminal is connected to a first signal terminal of the first semiconductor module, a second terminal is connected to a second signal terminal of the first semiconductor module, and a third terminal and a fourth terminal are connected to the first external connection terminal; and
a fourth choke coil in which a first terminal is connected to a first signal terminal of the second semiconductor module, a second terminal is connected to a second signal terminal of the second semiconductor module, and a third terminal and a fourth terminal are connected to the first external connection terminal.

10. The power converter according to claim 7, comprising the first semiconductor module and the second semiconductor module, wherein
the power converter comprises: on the multilayer substrate,
a fifth choke coil in which a first terminal is connected to a third signal terminal of the first semiconductor module, a second terminal is connected to a fourth signal terminal of the first semiconductor module, and a third terminal and a fourth terminal are connected to the second external connection terminal; and
a sixth choke coil in which a first terminal is connected to a third signal terminal of the second semiconductor module, a second terminal is connected to a fourth signal terminal of the second semiconductor module, and a third terminal and a fourth terminal are connected to the second external connection terminal.

11. The power converter according to claim 1, wherein the first wire and the second wire of the multilayer substrate are formed adjacent to each other, while the third wire and the fourth wire of the multilayer substrate are formed adjacent to each other.

* * * * *